United States Patent
Maniwa et al.

(10) Patent No.: US 9,319,012 B2
(45) Date of Patent: Apr. 19, 2016

(54) AMPLIFYING APPARATUS

(71) Applicant: FUJITSU LIMITED, Kawasaki-shi, Kanagawa (JP)

(72) Inventors: Toru Maniwa, Setagaya (JP); Shigekazu Kimura, Yokohama (JP); Nobuhisa Aoki, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/318,817

(22) Filed: Jun. 30, 2014

(65) Prior Publication Data

US 2015/0008983 A1 Jan. 8, 2015

(30) Foreign Application Priority Data

Jul. 2, 2013 (JP) ................. 2013-139033

(51) Int. Cl.
*H03F 3/68* (2006.01)
*H03F 3/191* (2006.01)
*H03F 3/24* (2006.01)
*H03F 3/19* (2006.01)
*H03F 1/02* (2006.01)
*H03F 1/56* (2006.01)

(52) U.S. Cl.
CPC .............. *H03F 3/245* (2013.01); *H03F 1/0288* (2013.01); *H03F 1/56* (2013.01); *H03F 3/19* (2013.01); *H03F 2200/451* (2013.01); *H03F 2203/21139* (2013.01)

(58) Field of Classification Search
CPC ............. H03F 3/68; H03F 3/191; H03F 3/60; H03F 3/211; H03F 3/19; H03F 3/245; H03F 1/02; H03F 2200/451; H03F 2203/21139
USPC ............................. 330/295, 302, 149, 124 R
See application file for complete search history.

(56) References Cited

U.S. PATENT DOCUMENTS

| 6,577,199 B2 * | 6/2003 | Dent ............................ 330/302 |
| 2005/0030104 A1 | 2/2005 | Chen |
| 2009/0201089 A1 * | 8/2009 | Kawanabe et al. ........... 330/277 |

FOREIGN PATENT DOCUMENTS

| JP | 2005-057703 | 3/2005 |
| JP | 2008-135829 | * 6/2008 ................ H03F 3/60 |
| JP | 2009-213090 | 9/2009 |
| JP | 2012-134823 | 7/2012 |

OTHER PUBLICATIONS

S. C. Cripps et al., "On the Continuity of High Efficiency Modes in Linear RF Power Amplifiers", IEEE Microwave and Wireless Components Letters, vol. 19, No. 10, pp. 665-667, Oct. 2009.

* cited by examiner

*Primary Examiner* — Steven J Mottola
*Assistant Examiner* — Hafizur Rahman
(74) *Attorney, Agent, or Firm* — Fujitsu Patent Center

(57) ABSTRACT

An amplifying apparatus, including an amplitude-phase conversion unit to separate an input signal into first and second signals, wherein a phase difference between the first and second signals depends on an amplitude of the input signal, a first amplifying unit, a first matching circuit including a main line and a first harmonic processing circuit, wherein a length of the line of the first harmonic processing circuit short-circuits a harmonic, a second amplifying unit, a second matching circuit including a main line and a second harmonic processing circuit, wherein a length of the line of the second harmonic processing circuit short-circuits a harmonic, and an output synthesis unit to synthesize outputs from the first and second matching circuits, wherein a distance from the first amplifying unit to the first harmonic processing circuit differs from a distance from the second amplifying unit to the second harmonic processing circuit.

3 Claims, 18 Drawing Sheets

AMPLIFYING APPARATUS

CROSS-REFERENCE TO RELATED APPLICATION

This application is based upon and claims the benefit of priority of the prior Japanese Patent Application No. 2013-139033, filed on Jul. 2, 2013, the entire contents of which are incorporated herein by reference.

FIELD

The embodiments described herein are related to an amplifying apparatus.

BACKGROUND

Wireless base stations such as mobile phone networks amplify and send CDMA signals and OFDM signals. The differences between the average values and the peak values of the transmission powers of these signals roughly range from 7 dB to 10 dB. A normal high-frequency power amplifier faces a problem that the conversion efficiency from power source to high-frequency power for the peak output power is high whereas the conversion efficiency for the average output power is low and the power consumption increases. Therefore, various types of high-frequency power amplifiers have been developed including Doherty type amplifiers and Out-Phasing type amplifiers, with which the conversion efficiency for the average output power can be high and the power consumption can be decreased.

In a general wireless base station, a signal processing unit processes transmitting signals to suppress the peak powers and distorts the signals and then the transmitting signals are input into an amplifier.

FIG. 1 is a diagram illustrating a configuration example of a Doherty type amplifier. A signal processing unit in the Doherty type amplifier processes transmitting signals and the processed signals are subject to a frequency conversion and converted into a frequency used for transmission. The converted signals are branched into a carrier amplifier and a peak amplifier. The carrier amplifier is generally biased from Class B to Class AB so as to start the operation from an area in which the input signal power is low. On the other hand, the peak amplifier is generally biased to Class C so that the peak amplifier does not operate in the area in which the input signal power is low and the amplifying element is switched off so that the power consumption is kept low. Thus, the carrier amplifier operates and the peak amplifier does not operate until the input signal power reaches a certain level. And the conversion efficiency of the amplifier maximizes at the level. After the input signal power exceeds the level, the peak amplifier starts to operate and the output power increases. And the conversion efficiency decreases once and then maximizes again at the level in which both amplifiers reaches a saturation range. In the Doherty type amplifier, a λ/4 line is inserted between the carrier amplifier and the output coupled point. The λ/4 line converts the output load impedance to impedance near the high-efficiency operation point of the carrier amplifier when the peak amplifier is switched off. It is noted that the λ generally means a wave length at a center frequency.

FIG. 2 is a diagram illustrating a configuration example of the Out-Phasing type amplifier. A signal processing unit in the Out-Phasing type amplifier processes transmitting signals and the processed signals are separated into two signals with different phases and certain amplitude by an amplitude phase conversion unit. The processed signal is separated into two reversed-phase signals when the amplitude of the processed signal is zero and into two in-phase signals when the amplitude of the processed signal maximizes. The two separated signals are subject to a frequency conversion and converted into signals with frequencies used for transmission and input into amplifying elements. Since signals with the fixed amplitude are input into the amplifying elements, the amplifying elements can operate with high conversion efficiency. Each output from the amplifying elements is subject to a vector synthesis in a synthesizer. As a result, the synthesizer outputs the input signals as amplified transmitting signals. The synthesizer generally includes the first transmission line and the second transmission line with the total length of the half wavelength. The efficiency of the Out-Phasing type amplifier can be high even at the output power level below the peak output power.

Patent Document

[Patent document 1] Japanese Laid-Open Patent Publication No. 2009-213090
[Patent document 2] Japanese Laid-Open Patent Publication No. 2008-135829
[Patent document 3] Japanese Laid-Open Patent Publication No. 2012-134823
[Patent document 4] Japanese Laid-Open Patent Publication No. 2005-57703

Non-Patent Document

[Non-patent document 1] S. C. Cripps, P. J. Tasker, A. L. Clarke, J. Lees, J. Benedikt, "On the Continuity of High Efficiency Modes in Linear RF Power Amplifiers," IEEE Microwave and Wireless Components Letters, vol. 19, no. 10, pp. 665-667, October 2009.

SUMMARY

According to an aspect of the embodiments, it is provided an amplifying apparatus, including an amplitude-phase conversion unit to separate an input signal into a first signal with a predetermined amplitude and a second signal with the predetermined amplitude, wherein a phase difference between the first signal and the second signal depends on an amplitude of the input signal, a first amplifying unit to amplify the first signal, a first matching circuit including a main line connected with the first amplifying unit and a first harmonic processing circuit connected with the main line, wherein a length of the line of the first harmonic processing circuit short-circuits a harmonic from the first amplifying unit, a second amplifying unit to amplify the second signal, a second matching circuit including a main line connected with the second amplifying unit and a second harmonic processing circuit connected with the main line of the second matching circuit, wherein a length of the line of the second harmonic processing circuit short-circuits a harmonic from the second amplifying unit, and an output synthesis unit to synthesize an output from the first matching circuit and an output from the second matching circuit, wherein a distance from the output side of the first amplifying unit to the first harmonic processing circuit via the main line of the first matching circuit differs from a distance from the output side of the second amplifying unit to the second harmonic processing circuit via the main line of the second matching circuit.

The object and advantages of the invention will be realized and attained by means of the elements and combinations particularly pointed out in the claims.

DESCRIPTION OF EMBODIMENTS (Comparative Example)

First, a comparative example of an amplifying apparatus according to one embodiment is described with reference to the drawings. The proportion of data communications performed by mobile phones is becoming larger than the proportion of audio communications and faster data communications are expected for the mobile phones. A wider bandwidth for transmitting signals is expected to be achieved for the faster data communications. In the Doherty type amplifiers and the Out-Phasing type amplifiers, a $\lambda/4$ line, namely, a quarter-wave line or a line with the total length of $\lambda/2$ is included in the circuit and the amplifiers face a problem that wider bandwidth cannot be easily achieved. For example, the length of the $\lambda/4$ line is $\lambda/4$ at the center frequency of the bandwidth but the length of the line becomes shorter than $\lambda/4$ for the wavelength at the lower edge of the bandwidth. On the other hand, the length of the line becomes longer than $\lambda/4$ for the wavelength at the upper edge of the bandwidth.

Figure 3:
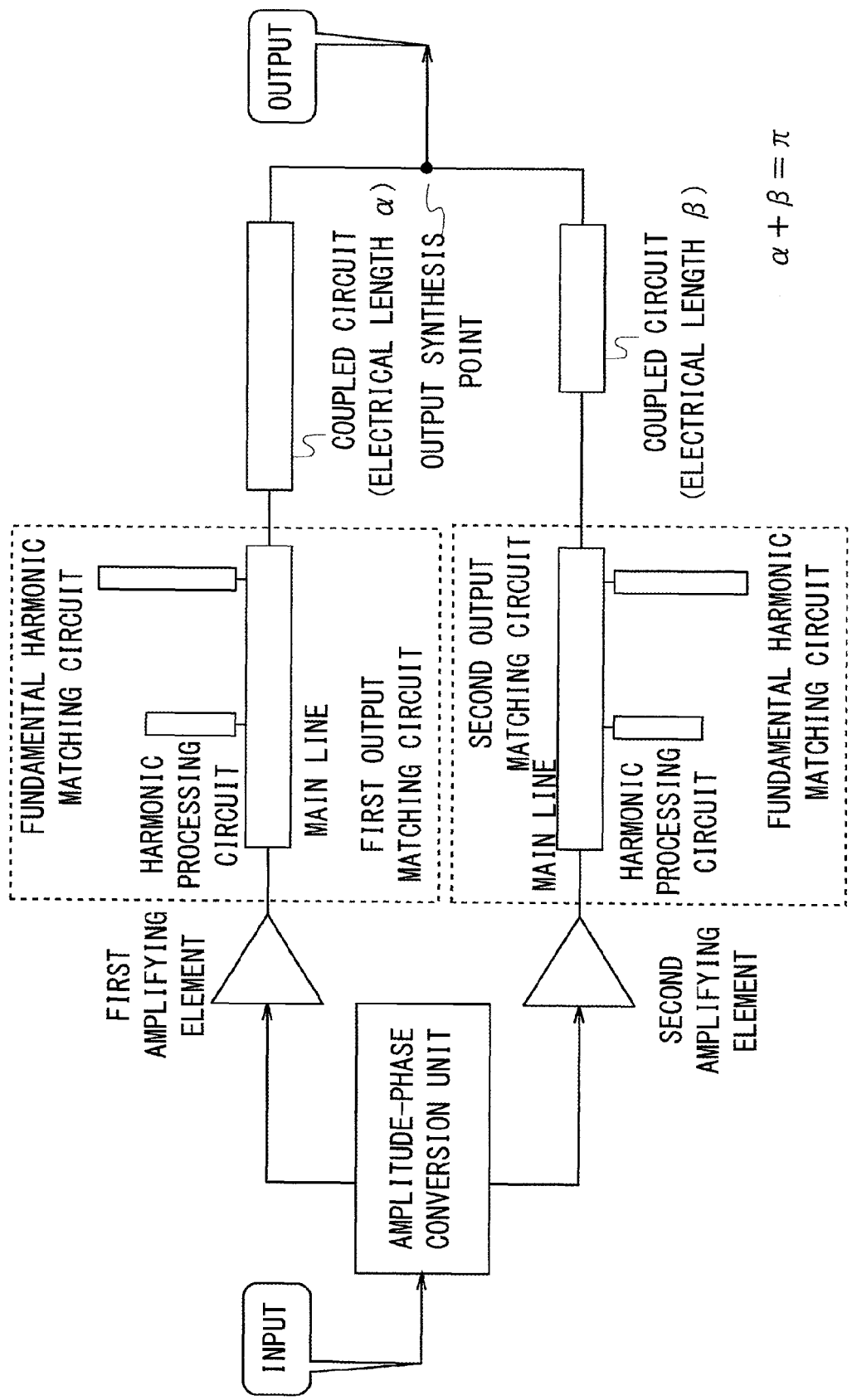
FIG. 3 is a diagram illustrating a configuration example of an ordinary Out-Phasing type amplifier.

FIG. 3 is a diagram illustrating a configuration example of a normal Out-Phasing type amplifier. The first and second amplifying elements are equivalent and set with a bias condition. In addition, the electrical properties of the first and second output matching circuits are equivalent to each other. The first and second output matching circuits respectively include a main line, a fundamental harmonic matching circuit and a harmonic processing circuit. The harmonic processing circuit is set with a condition so that the efficiency is maximized when the fundamental harmonic load is represented by real numbers. The fundamental harmonic is a wave with a frequency of the center of the frequency band for signals amplified by an amplifier. The fundamental harmonic length is the length of the fundamental harmonic. The fundamental frequency is the frequency of the fundamental harmonic. When a transmission line with an electrical length $\alpha$ and a transmission line with an electrical length $\beta$ are connected with the junction for the output, each amplifying element can operate with low output electricity and achieve high efficiency. It is noted that the sum of the electrical lengths $\alpha$ and $\beta$ is $\lambda/2$ of the fundamental harmonic, which corresponds to a propagation phase of n.

Figure 2:
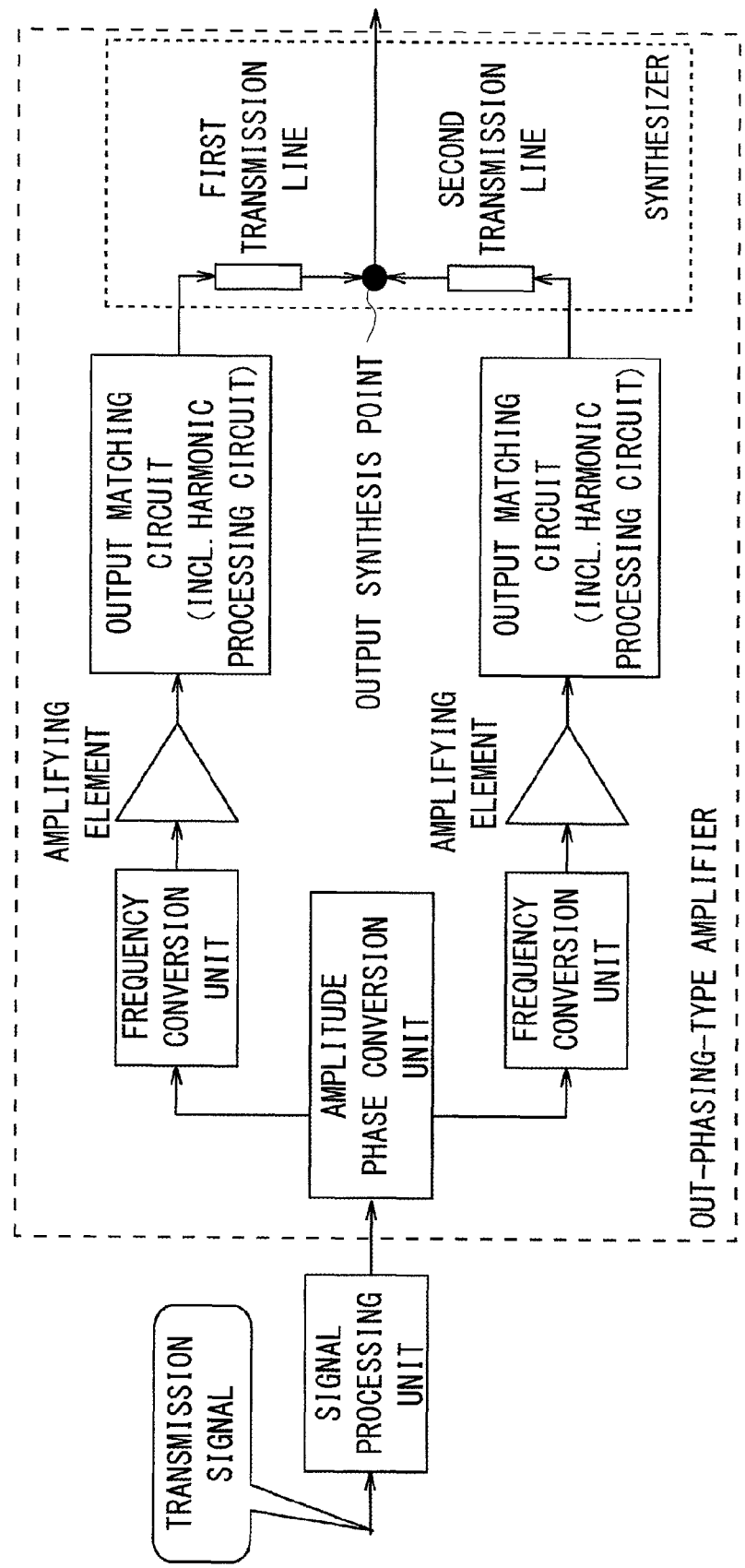
FIG. 2 is a diagram illustrating a configuration example of an Out-Phasing type amplifier.
Figure 4:
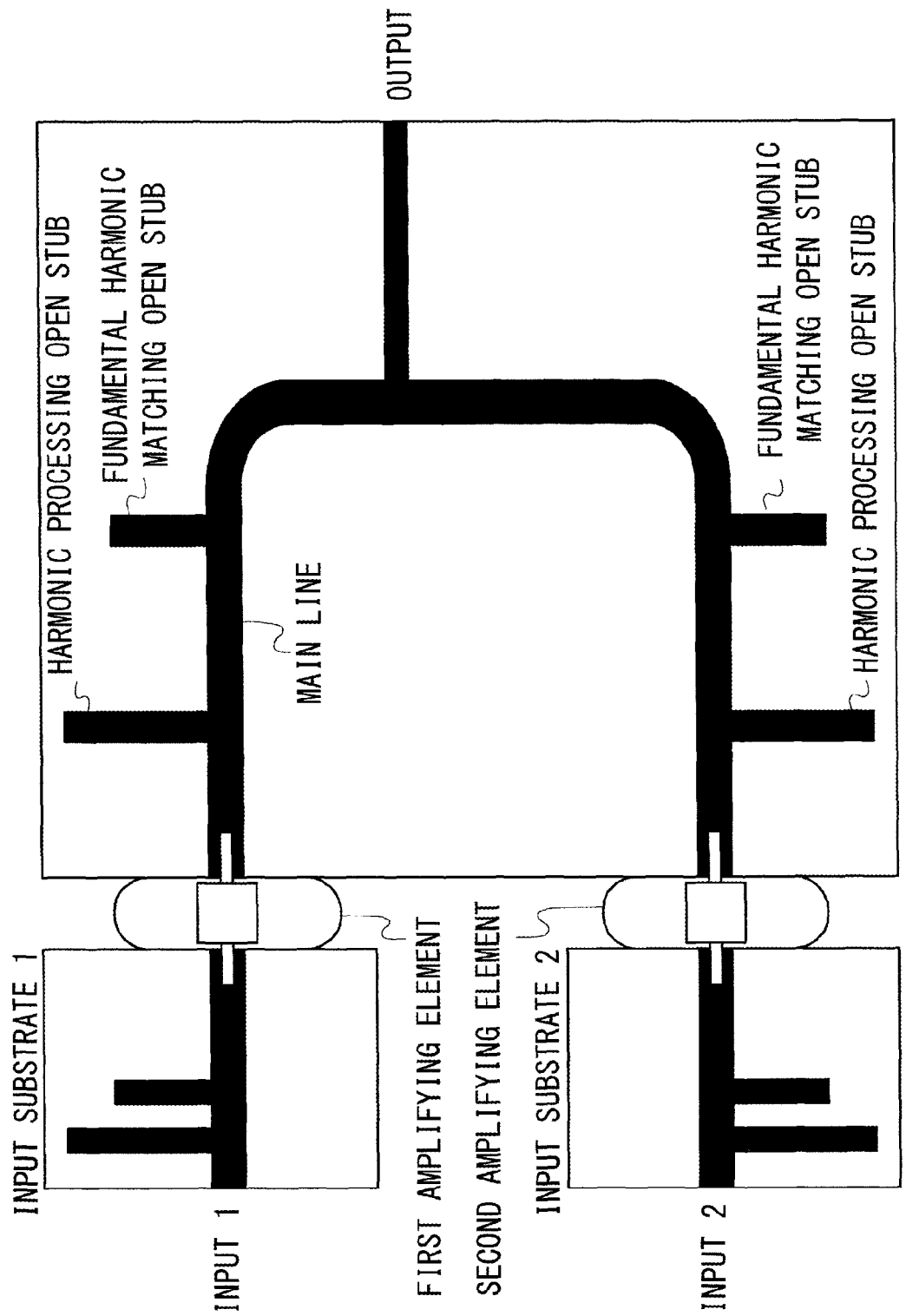
FIG. 4 is a diagram illustrating an implementation of the configuration example as illustrated in FIG. 3.

In addition, FIG. 4 is a diagram illustrating an implementation example of the configuration as illustrated in FIG. 3. The input side of the first amplifying element in FIG. 3 corresponds to an input substrate 1 in FIG. 4. And the input side of the second amplifying element corresponds to an input substrate 2 in FIG. 2. The first and second output matching circuits and the coupled circuits and the output as illustrated in FIG. 3 correspond to a main line pattern, harmonic circuits, fundamental harmonic matching circuits and the like in FIG. 4. The amplification achieved in FIG. 4 is similar to the amplification achieved in FIG. 3.

However, since the frequencies of the input signals used in FIGS. 3 and 4 differ from each other, the stub lengths of the harmonic wave circuit and the fundamental harmonic matching circuit differ from each other. Nonetheless, the amplifications achieved in FIGS. 3 and 4 are substantially the same. For example, the stab lengths for the harmonic circuits in FIGS. 3 and 4 include the line lengths used for short-circuiting the harmonic waves generated from the amplifying elements, that is, for reflecting the harmonic waves.

Figure 5:
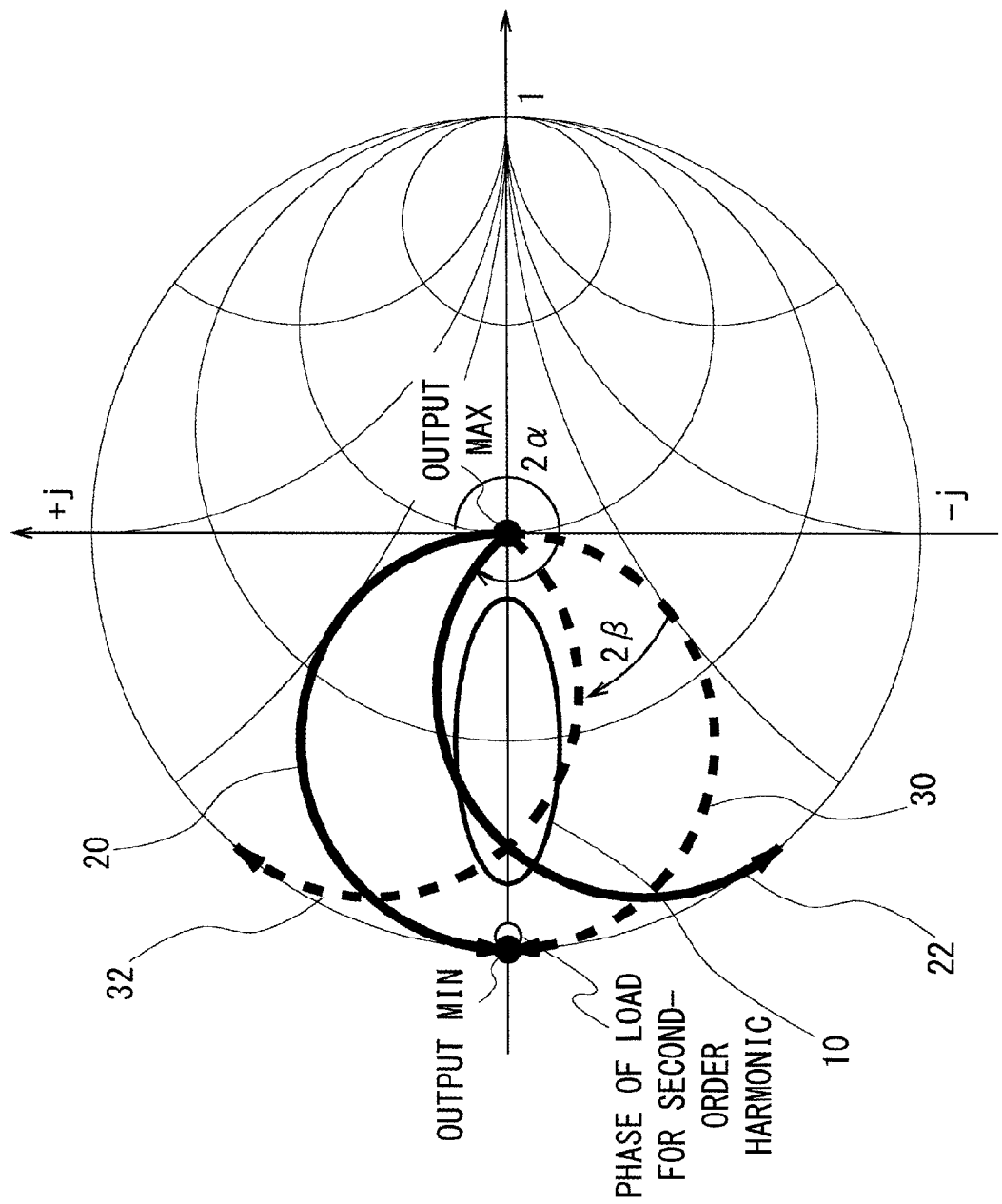
FIG. 5 is a diagram of a Smith chart illustrating the load from the amplifying element to the output side in the Out-Phasing type amplifier as illustrated in FIG. 3.

FIG. 5 is a diagram illustrating a Smith chart of the load from the amplifying element to the output side in the Out-Phasing type amplifier in FIG. 3. In the Smith chart in FIG. 5, the horizontal axis represents the real part of the reflection coefficient and the vertical axis represents the imaginary part of the reflection coefficient. The reflection coefficient and the load are in a one-to-one relation. The same applies to Smith charts described hereinafter.

The ellipsoidal closed curve 10 represents an example of a contour line of the efficiency of the load of the amplifying element. The closed curve 10 means a condition in which the efficiency increases when the load from the connection point of the amplifying element and the matching circuit to the output side is variable. The condition corresponds to a position at which the efficiency is a predetermined value. The inner the position is in the closed curve 10 the higher the efficiency is. The area enclosed by the closed curve 10 is an area in which the efficiency is higher than the predetermined value. The load in the area achieves an operation with efficiency higher than the predetermined value. Thus, when the loads corresponding to the inner positions in the closed curve 10 are achieved in a wide output range, the amplifier operates with higher efficiency.

On the other hand, the solid line 20 represents the value of the load from the output synthesis point to the first amplifier element side and the dotted line 30 represents the value of the load from the output synthesis point to the second amplifier element side. As for the signals which are subject to amplitude-phase conversions in the Out-Phasing type amplifier, the load from the connection point to each amplifying element when the phase difference varies from 0 degree to 180 degree moves outward from the center in the Smith chart. In order to bring the locus of the movement of the load closer to the closed curve 10, a line is inserted between the output synthesis point and the first amplifying element to achieve a phase angle α and the phase in the Smith chart is rotated.

The solid line 22 represents the value of the load from the output synthesis point to the first amplifying element after the rotation. The solid line 22 is obtained by rotating the solid line 20 by an angle 2α around the maximum output point. In addition, a line is inserted between the output synthesis point and the second amplifying element to achieve a phase angle β and the phase in the Smith chart is rotated. The solid line 32 represents the value of the load from the output synthesis point to the second amplifying element after the rotation. The solid line 32 is obtained by rotating the solid line 30 by an angle 2β around the maximum output point.

Generally, a passing phase obtained by adding the length of the line which achieves the phase angle α and the length of the line which achieves the phase angle β is n. Although the passing phase represents the correct value at the central frequency in the amplified bandwidth, the wave length at the central frequency differs from the wave lengths at the lower limit and the upper limit in the bandwidth. Therefore, when the length of the line increases, it is more difficult to achieve the advantageous performance throughout a wide bandwidth. In a general configuration, a reflection phase of a second-order harmonic is set as the same value to the tow amplifying elements. It is noted that the second-order harmonic is put in a short circuit condition. With the above comparative example in mind, it is an object in the below embodiments to provide an amplifying apparatus which can achieve high efficiency and can be applicable to a wide bandwidth. The embodiments are described below with reference to the drawings. Since the configurations described in the embodiments are mere examples, the configurations disclosed herein are not limited to the specific configurations in the embodiments. Any specific configurations according to the embodiments can be employed for enabling the disclosed configurations.

Embodiments

In A Doherty type amplifier or an Out-Phasing type amplifier, the output side of each matching circuit of the tow amplifying elements is connected with the output via a λ/4 line or a line with the total length of λ/2. These lines can achieve an optimum load with which the conversion efficiency can be optimized at the fundamental frequency. Generally, the matching circuit is connected with a harmonic processing circuit for reflecting harmonics in order to achieve a high efficient operation of the amplifying element. When the reflection phase of the harmonic processing circuit of the amplifying element is different from the reflection phase achieved by ordinary approaches such as a Class F amplifier and an inverse Class F amplifier, the load condition for the fundamental harmonic in order to achieve the high efficiency is changed. This means that the line length of the circuit to achieve the optimum load for the fundamental harmonic can be controlled by the position of the harmonic processing circuit. Thus, a connection circuit provided at the output side can be shorten or omitted and a wide bandwidth can be achieved by setting the position of the harmonic processing circuit to shorten the line length.

(Configuration Example 1-1)

Figure 6:
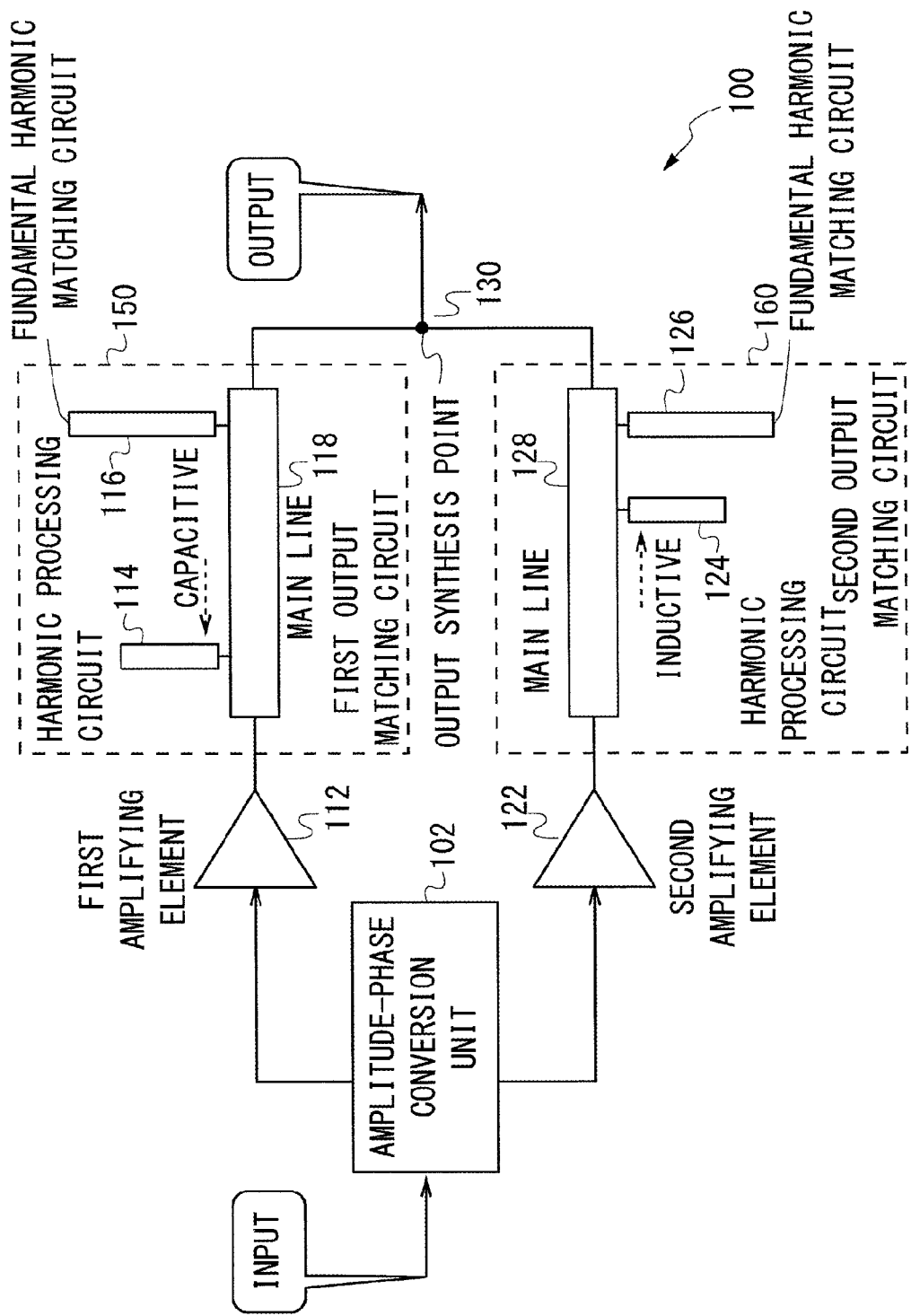
FIG. 6 is a diagram illustrating a configuration example of an amplifying apparatus 100 according to one embodiment.

FIG. 6 is a diagram illustrating a configuration example of an amplifying apparatus 100 in one embodiment. The amplifying apparatus 100 is an Out-Phasing type amplifying apparatus. The amplifying apparatus 100 as illustrated in FIG. 6 includes an amplitude-phase conversion unit 102, a first amplifying element 112, a first output matching circuit 150, a second amplifying element 122, a second output matching circuit 160 and an output synthesis point 130. The first output matching circuit 150 includes a harmonic processing circuit 114, a fundamental harmonic matching circuit 116 and a main line 118. The second output matching circuit 160 includes a harmonic processing circuit 124, a fundamental harmonic matching circuit 126 and a main line 128.

The amplitude-phase conversion unit 102 converts an input signal S(t) to two signals with an amplitude and a phase difference depending on the amplitude of the input signal. The amplitude-phase conversion unit 102 outputs one of the converted signals to the first amplifying element 112 and outputs the other of the converted signals to the second amplifying element 122. The signal S1(t) output to the first amplifying element 112 and the signal S2(t) output to the second amplifying element 122 can be expressed as follows.

$$S1(t)=Me^{-j\theta}$$

$$S2(t)=Me^{j\theta}$$

It is noted that M represents a maximum value of the input signal S(t). In addition, it is noted that θ is a value which equals to half of the phase difference between the signals S1(t) and S2(t) based on the amplitude of the signal S(t). M and θ can be expressed as follows.

$$M = \max(|S(t)|)$$

$$\theta = \cos^{-1}\left(\frac{S(t)}{M}\right)$$

It is noted that when θ is 0, the amplitude of the output signal from the amplifying apparatus 100 reaches the maximum value. In addition, it is noted that when θ is π/2, the amplitude of the output signal from the amplifying apparatus 100 reaches 0.

The first amplifying element 112 amplifies the signal S1(t). The amplitude M of the signal S1(t) is constant. Therefore, an element which can efficiently amplify the signal with the amplitude M is selected as the first amplifying element 112.

The harmonic processing circuit 114 is a circuit for determining impedance for the second-order harmonic in the amplifying apparatus 100. The harmonic processing circuit 114 is provided at a position which is closer to the first amplifying element 112 than the position determined by the condition in which the efficiency can be maximized when the load of the fundamental harmonic is represent by real number. With this arrangement, the reflection phase of the harmonic becomes capacitive. The harmonic processing circuit 114 is an open stab with the length of λ/8 of the fundamental harmonic in the case of the second-order harmonic. The harmonic processing circuit 114 is connected in parallel with the first amplifying element 112.

The fundamental harmonic matching circuit 116 is a circuit for achieving impedance matching for the fundamental harmonic, namely, fundamental harmonic frequency in the amplifying apparatus 100.

The main line 118 is provide between the first amplifying element 112 and the output synthesis point 130. The harmonic processing circuit 114 and the fundamental harmonic matching circuit 116 are connected with the main line 118.

The second amplifying element 122 amplifies the signal S2(t). The amplitude M of the signal S2(t) is constant. Therefore, an element which can effectively amplifying the signal with the amplitude M is selected as the second amplifying element 122.

When the gain for the amplitude M of the first amplifying element 112 is denoted by A and the gain for the amplitude M of the second amplifying element 122 is denoted by B, the output signal S11(t) from the first amplifying element 112 and the output signal S21(t) from the second amplifying element 122 can be expressed as follows.

$$S11(t) = AMe^{-j\theta}$$

$$S21(t) = BMe^{j\theta}$$

The harmonic processing circuit 124 is a circuit for determining impedance for the second-order harmonic of the fundamental harmonic in the amplifying apparatus 100. The harmonic processing circuit 124 is provided at a position which is farther away from the second amplifying element 122 than the position determined by the condition in which the efficiency can be maximized when the load of the fundamental harmonic is represent by real number. With this arrangement, the reflection phase of the harmonic becomes inductive. The harmonic processing circuit 124 is an open stab with the length of λ/8 of the fundamental harmonic in the case of the second-order harmonic. The harmonic processing circuit 124 is connected in parallel with the first amplifying element 122.

The position of the harmonic processing circuit 114 relative to the first amplifying element 112 differs from the position of the harmonic processing circuit 124 relative to the second amplifying element 122.

The fundamental harmonic matching circuit 126 is a circuit for achieving an impedance matching for the fundamental harmonic, namely, the fundamental harmonic frequency in the amplifying apparatus 100.

The main line 128 is provide between the second amplifying element 122 and the output synthesis point 130. The harmonic processing circuit 124 and the fundamental harmonic matching circuit 126 are connected with the main line 128.

The outputs from the first amplifying element 112 and the second amplifying element 122 are subject to a fundamental harmonic matching and then directly synthesized with each other at the output synthesis point 130.

The reflection coefficient ρ1 at the output synthesis point 130 on the side of the first amplifying element 112 can be expressed as follows. It is assumed here that half of the amplitude of the output from the first amplifying element 112 is reflected at the output synthesis point 130 and that half of the amplitude of the output from the second amplifying element 122 is reflected at the output synthesis point 130 and input into the first amplifying element 112 side.

$$\rho 1 = \frac{-0.5\ AMe^{-j\theta} + 0.5\ BMe^{j\theta}}{AMe^{-j\theta}}$$

The gain A for the first amplifying element 112 and the gain B for the second amplifying element 122 are the same in the Out-Phasing type amplifier. With this relationship (A=B), the reflection coefficient ρ1 can be expressed as follows.

$$\rho 1 = 0.5(-1 + e^{j2\theta})$$

Similarly, the reflection coefficient ρ2 can be expressed as follows.

$$\rho 2 = 0.5(-1 + e^{-j2\theta})$$

Figure 7:
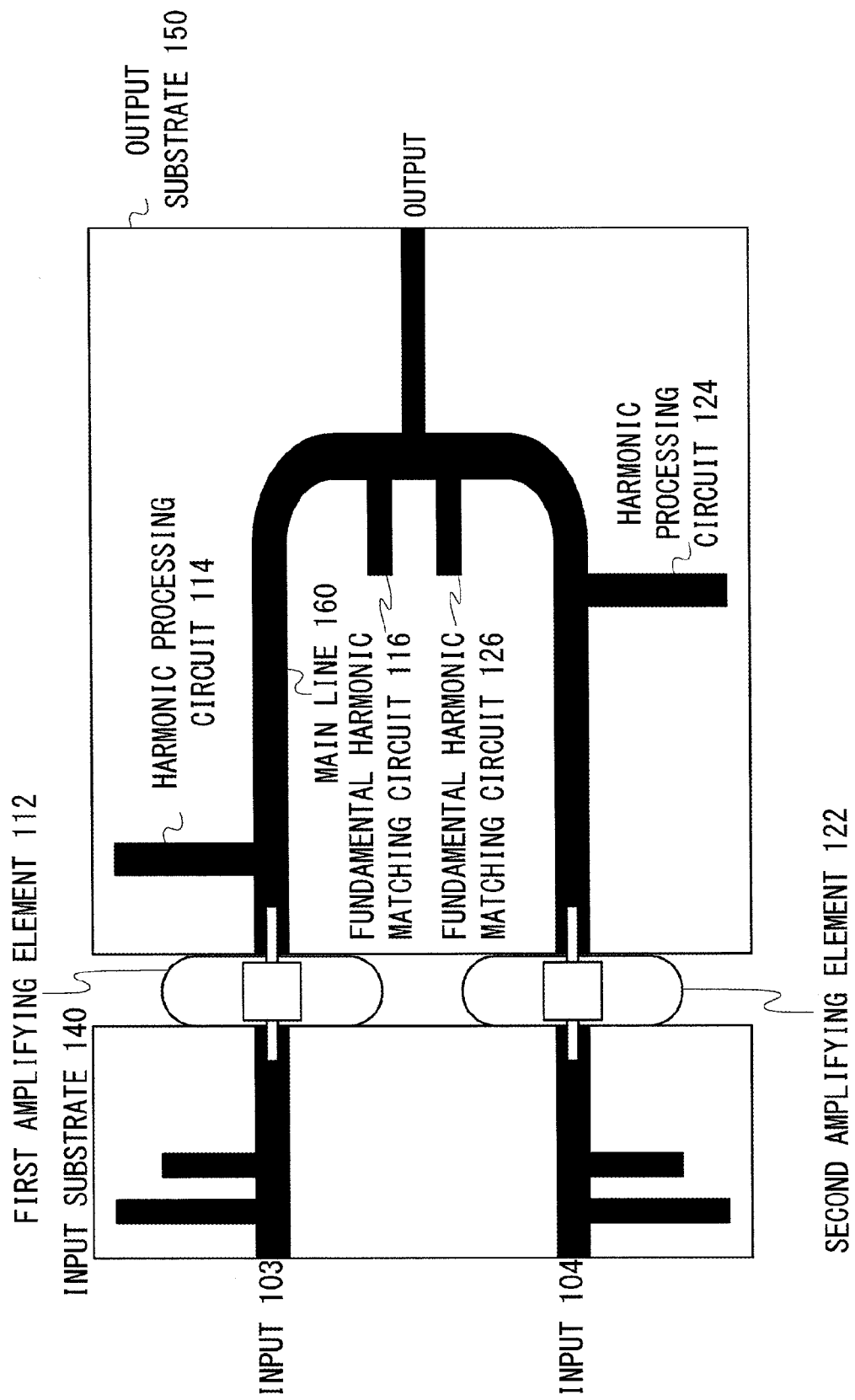
FIG. 7 is a diagram illustrating an example of a specific implementation of the configuration example as illustrated in FIG. 6.

Additionally, FIG. 7 is a diagram illustrating a specific example of the implementation of the configuration as illustrated in FIG. 6. The input side of the first amplifying element 112 and the input side of the second amplifying element 122 as illustrated in FIG. 6 correspond to an input substrate 140 in FIG. 7. The first and second output matching circuit 150, 160 and the outputs from the circuits correspond to the pattern of a main line 160, harmonic processing circuits 114, 124, and fundamental harmonic matching circuits 116, 126 etc. formed on the output substrate 150. The operations performed in FIG. 7 are similar to the amplification operations performed in FIG. 6. However, since the frequencies of the input signals are different between the circuits in FIGS. 6 and 7, the stub lengths of the harmonic processing circuits and the fundamental harmonic matching circuits are different between FIGS. 6 and 7. Nonetheless, the operations of the harmonic processing circuits and the fundamental harmonic matching circuits are substantially equivalent between FIGS. 6 and 7.

Figure 8:
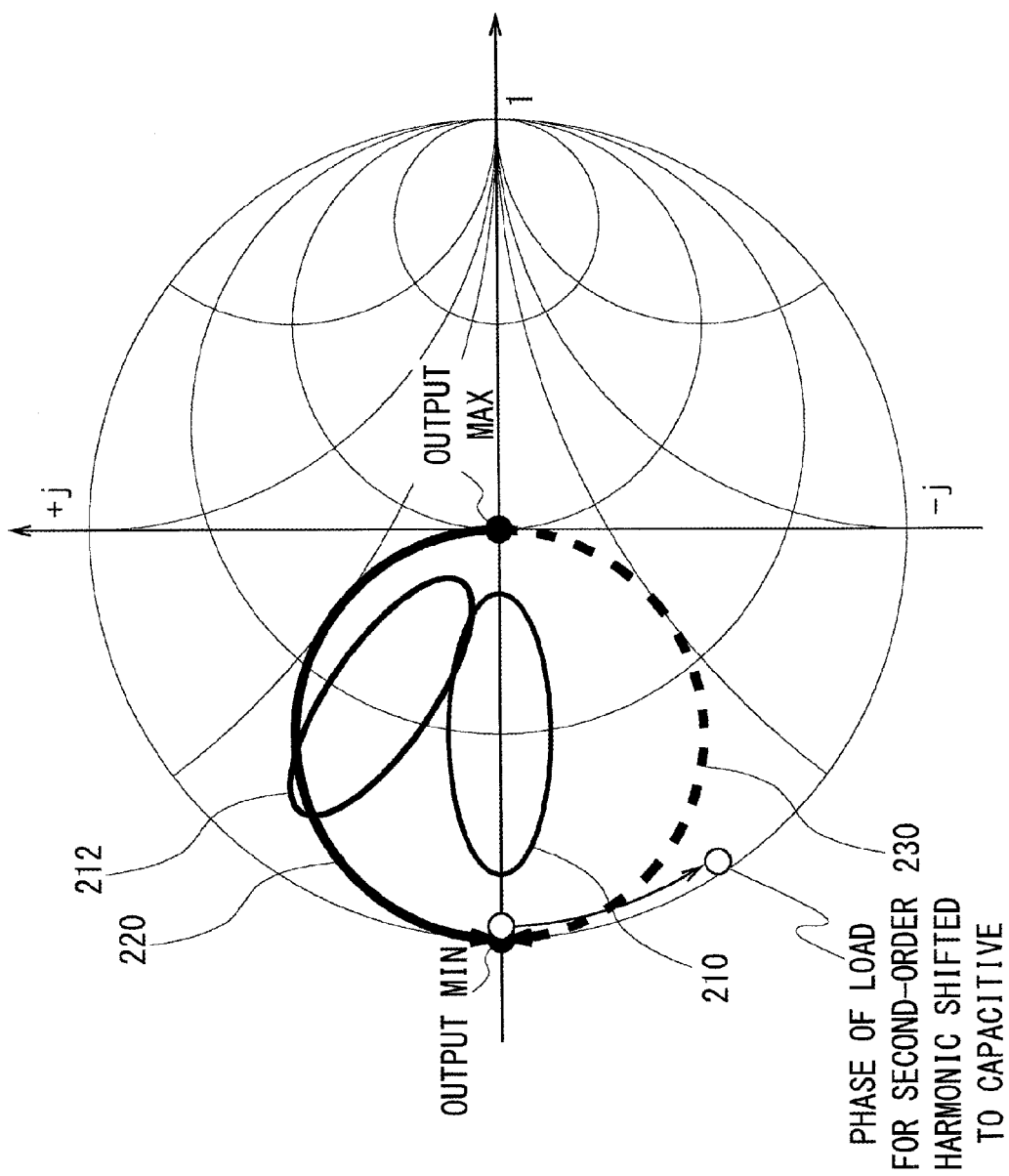
FIG. 8 is a diagram of a Smith chart illustrating the load from an output synthesis point to a first amplifying element.

FIG. 8 is a diagram of a Smith chart illustrating an example of the load from the output synthesis point to the first amplifying element. An ellipsoidal closed curve 210 is similar to the closed curve 10 as illustrated in FIG. 5. A closed curve 212 is ellipsoidal and represents an area, namely, a condition in which the efficiency increases when the load is varied at a position between the position at which the first amplifying element 112 is connected with the matching circuit and the output side. The area inside of the closed curve 212 represents an area in which the efficiency is higher than a predetermined value. The solid line 220 represents values of the load from the output synthesis point 130 to the first amplifying element 112. And the broken line represents values of the load from the output synthesis point 130 to the second amplifying element 122.

When the reflection phase of the second-order harmonic on the side of the first amplifying element 112 is shifted to be capacitive, the closed curve 212 is shifted to be closer to the inductive side than the closed curve 210 is to the inductive side. The closed curve 212 is closer to the solid line 220. Therefore, the amplifying apparatus 100 which is an Out-Phasing type amplifier can use a signal to which an amplitude-phase conversion is performed to set an optimum load condition of the first amplifying element 112 at a position near the load from the output synthesis point 130 to the first amplifying element 112 which is determined when the phase is changed. That is, the amplifying apparatus 100 can set an area in which the efficiency increases to be closer to the load from the output synthesis point 130 to the first amplifying element 112 without use of a transmission line.

Figure 9:
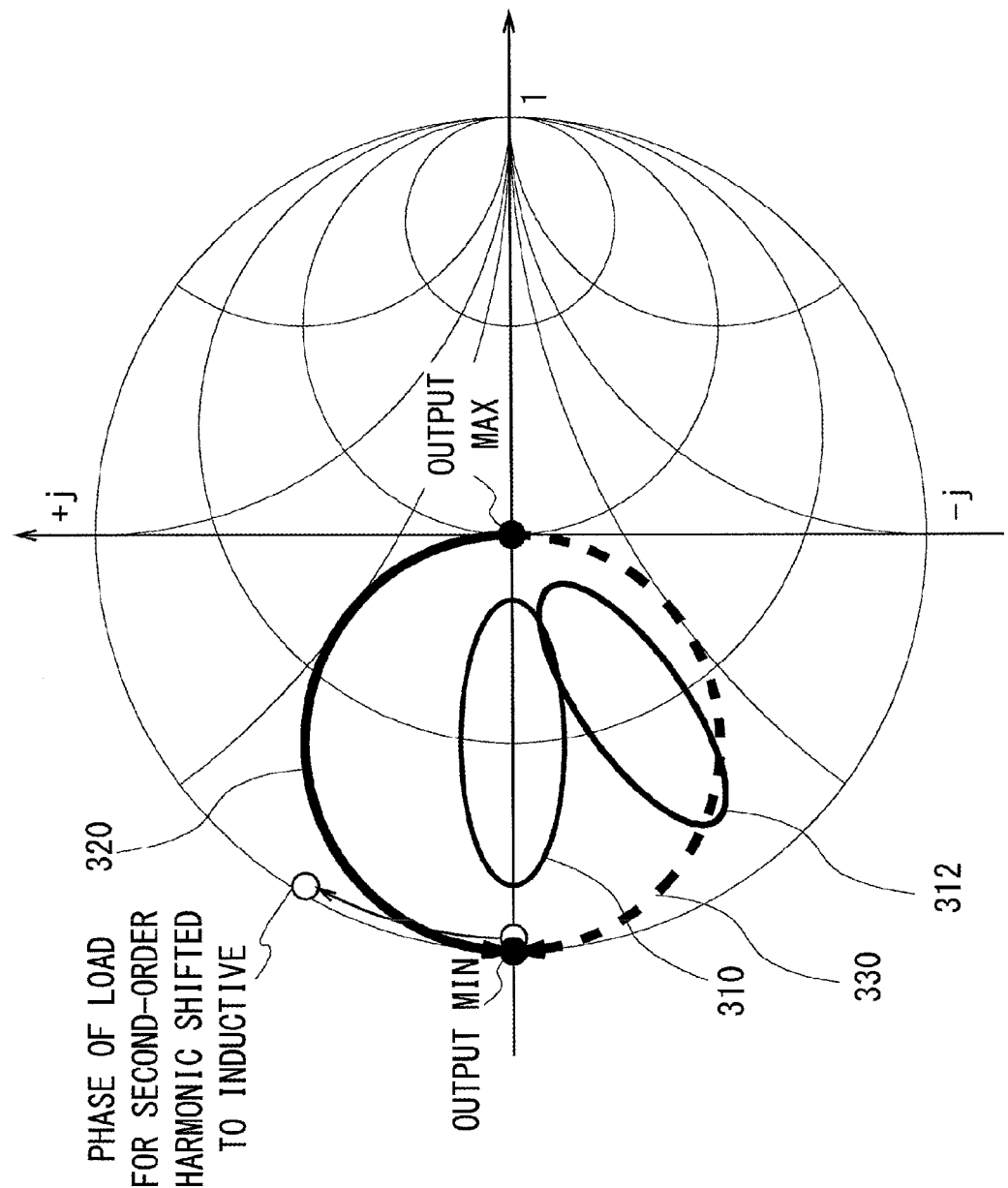
FIG. 9 is a diagram of a Smith chart illustrating the load from an output synthesis point to a second amplifying element.

FIG. 9 is a diagram of a Smith chart illustrating an example of the load from the output synthesis point to the second amplifying element. The ellipsoidal closed curve 310 is similar to the closed curve 10 as illustrated in FIG. 5. The closed curve 312 is ellipsoidal and represents an area, namely, a condition in which the efficiency increases when the load is varied on the output side for the connection point at which the second amplifying element 122 is connected with the matching circuit. The efficiency is higher than a predetermined value in the area inside of the closed curve 312. The solid line 320 represents values of the load from the output synthesis point to the first amplifying element 112. The solid line 320 is the locus of the load when the value θ of the reflection coefficient ρ1 is changed from 0 to π/2. The broken line 330 represents values of the load from the output synthesis point to the second amplifying element 122. The broken line 330 is the locus of the load when the value θ of the reflection coefficient ρ2 is changed from 0 to π/2.

When the reflection phase of the second-order harmonic on the side of the second amplifying element 122 is changed to be inductive, the closed curve 312 is shifted to be closer to the capacitive side than the closed curve 310 is to the capacitive side. The closed curve 312 is closer to the broken line 330. Therefore, the amplifying apparatus 100 which is an Out-Phasing type amplifier can use a signal which is subject to an amplitude-phase conversion to set an optimum load condition of the second amplifying element 122 at a position near the load from the output synthesis point 130 to the second amplifying element 122 which is determined when the phase is changed. That is, the amplifying apparatus 100 can set an area in which the efficiency increases to be closer to the load from the output synthesis point 130 to the first amplifying element 122 without use of a transmission line.

Figure 10:
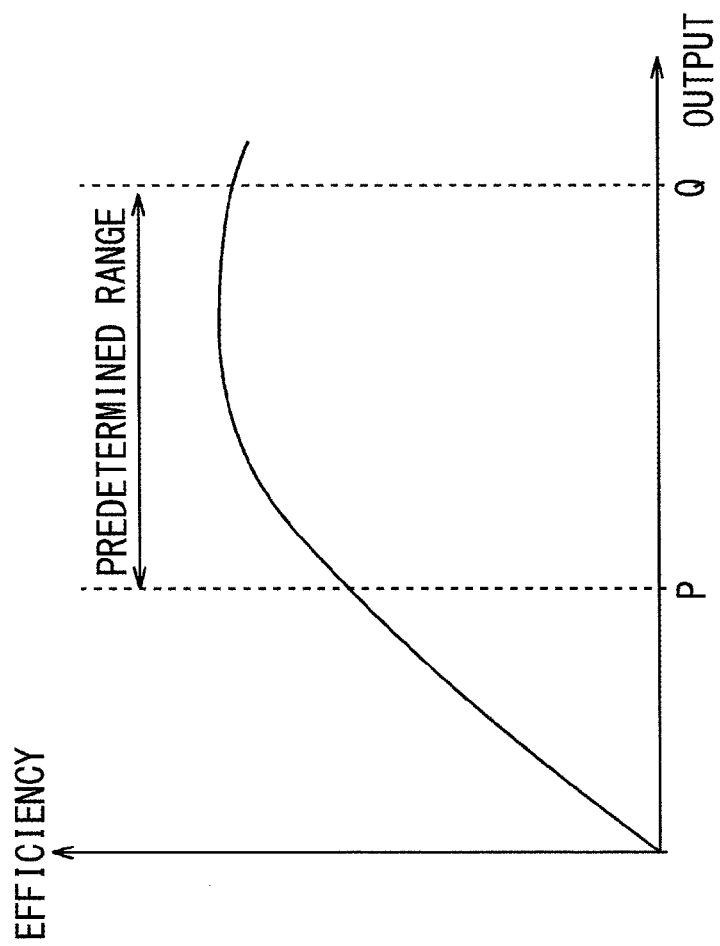
FIG. 10 is a diagram of a graph illustrating the relation between an output and efficiency in the amplifying apparatus 100.

FIG. 10 is a diagram of a graph illustrating a relation between the output and efficiency of the amplifying apparatus 100. In FIG. 10, the horizontal axis represents the output and the vertical axis represents the efficiency. The range of the amplitude of the output for the amplifying apparatus 100 can be determined in advance based on the input signals from an apparatus in the preceding stage etc. Thus, it is desirable to determine the positions of the harmonic processing circuits 114 and 124 in the predetermined range of the amplitude of the output determined in advance so that the efficiency of the amplifying apparatus can be increased. Namely, when the output range spans from the point P to the point Q, it is desirable to determine the position of the harmonic processing circuits 114 and 124 so that the value of integral of the efficiency between the point P and the point Q increases.

The amplifying apparatus 100 can set an optimum load for achieving high efficiency without inserting a transmission line for phase rotation between the output synthesis point 130 and a matching circuit for each amplifying element, by setting different second-order harmonic reflection phases for the two amplifying elements as described above. Therefore, since the line length can be 0, optimum wide-bandwidth operations can be achieved in the present example.

(Configuration Example 1-2)

The configuration example 1-2 includes properties in common with the configuration example 1-1. Thus, the differences are described here and the descriptions of the similarities are omitted here.

In the configuration example 1-1, one of the harmonic processing circuits connected with the main line is shifted to the capacitive property and the other of the harmonic processing circuits is shifted to the inductive property so that the range of load for achieving high efficiency is closer to the locus of the load from the output synthesis point to each amplifying element in the Smith chart. However, the range within which the harmonic processing circuit connected with the main line can be moved is a predetermined range depending on the physical shape of the main line etc. Therefore, some amplifying apparatus may face a difficulty to set the range of the load for high efficiency closer to the locus of the load from the output synthesis point to each amplifying element in the Smith chart in the configuration example 1-1. In this example, a transmission line is inserted between the main line and the output synthesis point to rotate the locus of the load. Thus, the range of the load for achieving high efficiency can be set to be closer to the locus of the load from the output synthesis point to each amplifying element in the Smith chart.

Figure 11:
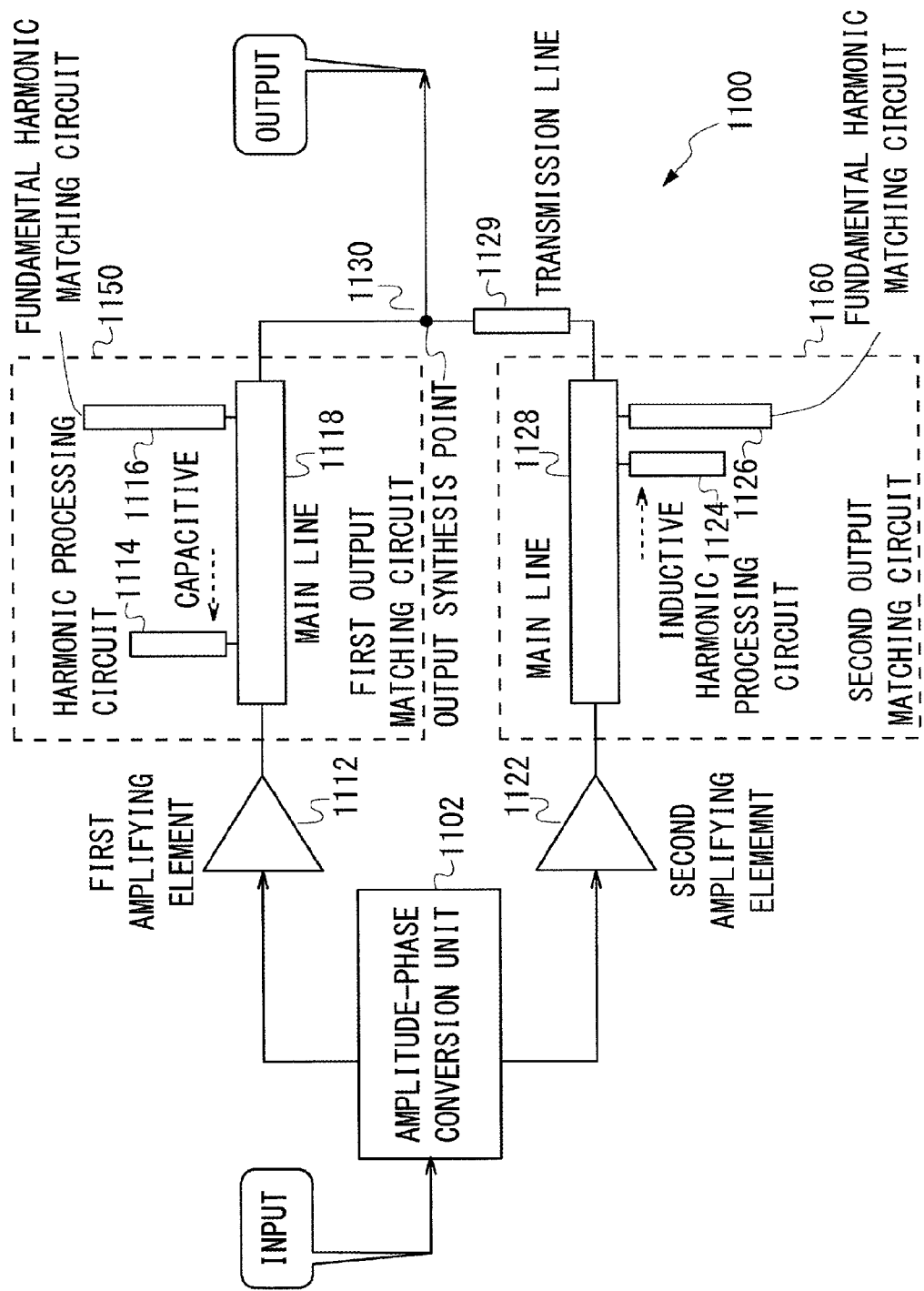
FIG. 11 is a diagram illustrating a configuration example of an amplifying apparatus 1100 according to one embodiment.

FIG. 11 is a diagram illustrating a configuration example of the amplifying apparatus 1100 in the present example. The amplifying apparatus 1100 is an Out-Phasing type amplifying apparatus. The amplifying apparatus 1100 includes an amplitude-phase conversion unit 1102, a first amplifying element 1112 and a first output matching circuit 1150. In addition, the amplifying apparatus 1100 includes a second amplifying element 1122, a second output matching circuit 1160, a transmission line 1120 and the output synthesis point 1130. The first output matching circuit 1150 includes a harmonic processing circuit 1114, a fundamental harmonic matching circuit 1116 and a main line 1118. The second output matching circuit 1160 includes a harmonic processing circuit 1124, a fundamental harmonic matching circuit 1126 and a main line 1128.

The configurations of the amplitude-phase conversion unit 1102 and the output synthesis point 1130 are similar to the configurations of the amplitude-phase conversion unit 102 and the output synthesis point 130 of the amplifying apparatus 100 respectively. The configurations of the first amplifying element 1112, the harmonic processing circuit 1114, the fundamental harmonic matching circuit 1116 and the main line 1118 are similar to the configurations of the first amplifying element 112, the harmonic processing circuit 114, the fundamental harmonic matching circuit 116 and the main line 118 of the amplifying apparatus 100 respectively. Additionally, the configurations of the second amplifying element 1122, the harmonic processing circuit 1124, the fundamental harmonic matching circuit 1126 and the main line 1128 are similar to the configurations of the second amplifying element 122, the harmonic processing circuit 124, the fundamental harmonic matching circuit 126 and the main line 128 of the amplifying apparatus 100 respectively.

The transmission line 1129 is inserted between the main line 1128 and the output synthesis point 1130. The transmission line 1129 is a transmission line, or an impedance conversion circuit, with an electrical length corresponding to a phase angle of γ which is smaller than π. The transmission line 1129 rotates the phase of the output by an angle of 2γ. Since the transmission line 1129 is provided, the locus of the load from the output synthesis point 1130 to the second amplifying element 1122 rotates in the Smith chart by an angle of 2γ around the maximum output point. This rotation differs from the case in which the transmission line 1129 is not inserted.

Figure 12:
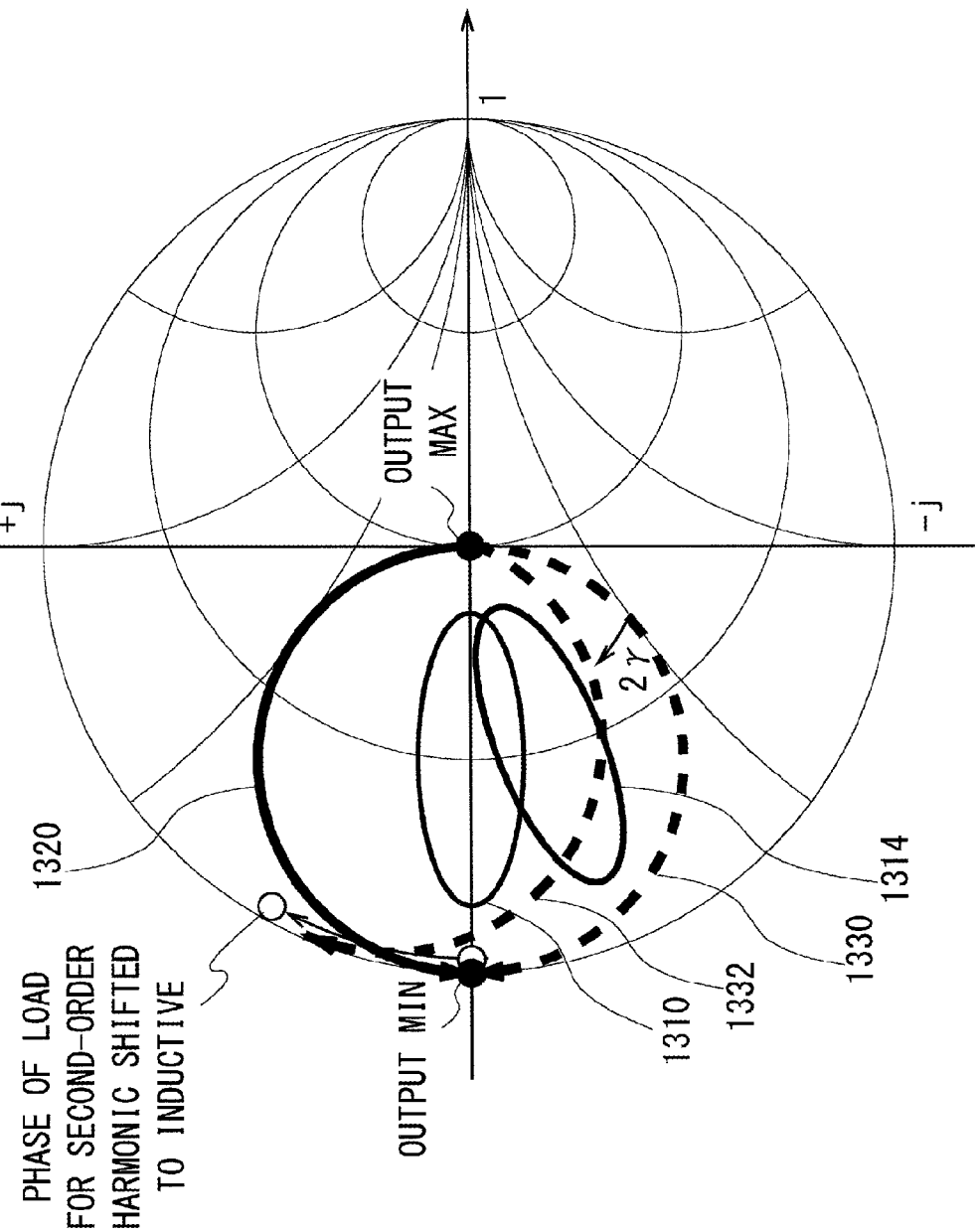
FIG. 12 is a diagram of a Smith chart illustrating the load from an output synthesis point to a second amplifying element.

FIG. 12 is a diagram of a Smith chart illustrating an example of the load from the output synthesis point to the second amplifying element. The ellipsoidal closed curve 1310 is similar to the closed curve 10 as illustrated in FIG. 5. The closed curve 1314 is ellipsoidal and represents an area in which the efficiency increases when the load is varied between the output and the point at which a matching circuit is connected with the second amplifying element 1122. The solid line 1320 represents values of the load from the output synthesis point to the first amplifying element 1112. The broken line 1330 is similar to the broken line 330 as illustrated in FIG. 9. The broken line 1332 is values of the load from the output synthesis point to the second amplifying element 1122. The transmission line for achieving a phase angle of γ is inserted between the output synthesis point 1130 and the main line 1128. Therefore, the locus of the load from the output synthesis point 1130 to the second amplifying element 1122 rotates by an angle of 2γ around the maximum output point.

When the reflection phase of the second-order harmonic on the side of the second amplifying element 1122 is shifted to the inductive property, the closed curve 1314 is shifted to be closer to the capacitive property than the closed curve 1310. That is, the closed curve 1314 is closer to the broken line 1330. However, it is difficult in some cases to shift the closed curve 1314 closer to the inductive property due to the physical shape of the main line 1128 etc. In this case, changing the position of the harmonic processing circuit may not achieve an amplifying apparatus with high efficiency. In the present example, the transmission line 1129 with an electrical length of γ is inserted between the main line 1128 and the output synthesis point 1130. Thus, the locus of the load rotates by an angle of 2γ around the maximum output point and the locus can be adjusted to achieve such high efficiency.

With the configurations as described above, an optimum load condition of the second amplifying element 1122 can be set near the load from the output synthesis point 1130 to the second amplifying element 1122 when the phase is varied with a signal which is subject to an amplitude-phase conversion in the amplifying apparatus 1100. That is, the amplifying apparatus 1100 can use a transmission line with an electrical length shorter than $\pi$ ($\lambda/2$) to shift the area for achieving high efficiency to the locus of the load from the output synthesis point 1130 to the second amplifying element 1122 in the Smith chart.

In the present example, a transmission line can be inserted between the main line 1118 and the output synthesis point 1130 instead of inserting a transmission line 1129 between the main line 1128 and the output synthesis point 1130. In this case, the locus of the load from the output synthesis point 1130 to the first amplifying element 1112 is rotated according to the electrical length of the transmission line. Further, a transmission line can be inserted between the main line 1118 and the output synthesis point 1130 and between the main line 1128 and the output synthesis point 1130.

The amplifying apparatus 1100 can an optimum load for achieving operations with high efficiency by shifting the two reflection phases of second-order harmonic of the two amplifying elements as described above and by inserting a transmission line for the phase rotation between the output synthesis point 1130 and the amplifying element. Thus, since the length of the transmission line can be shortened, optimum wide-bandwidth operations can be achieved in the present example.

(Configuration Example 2)

Figure 13:
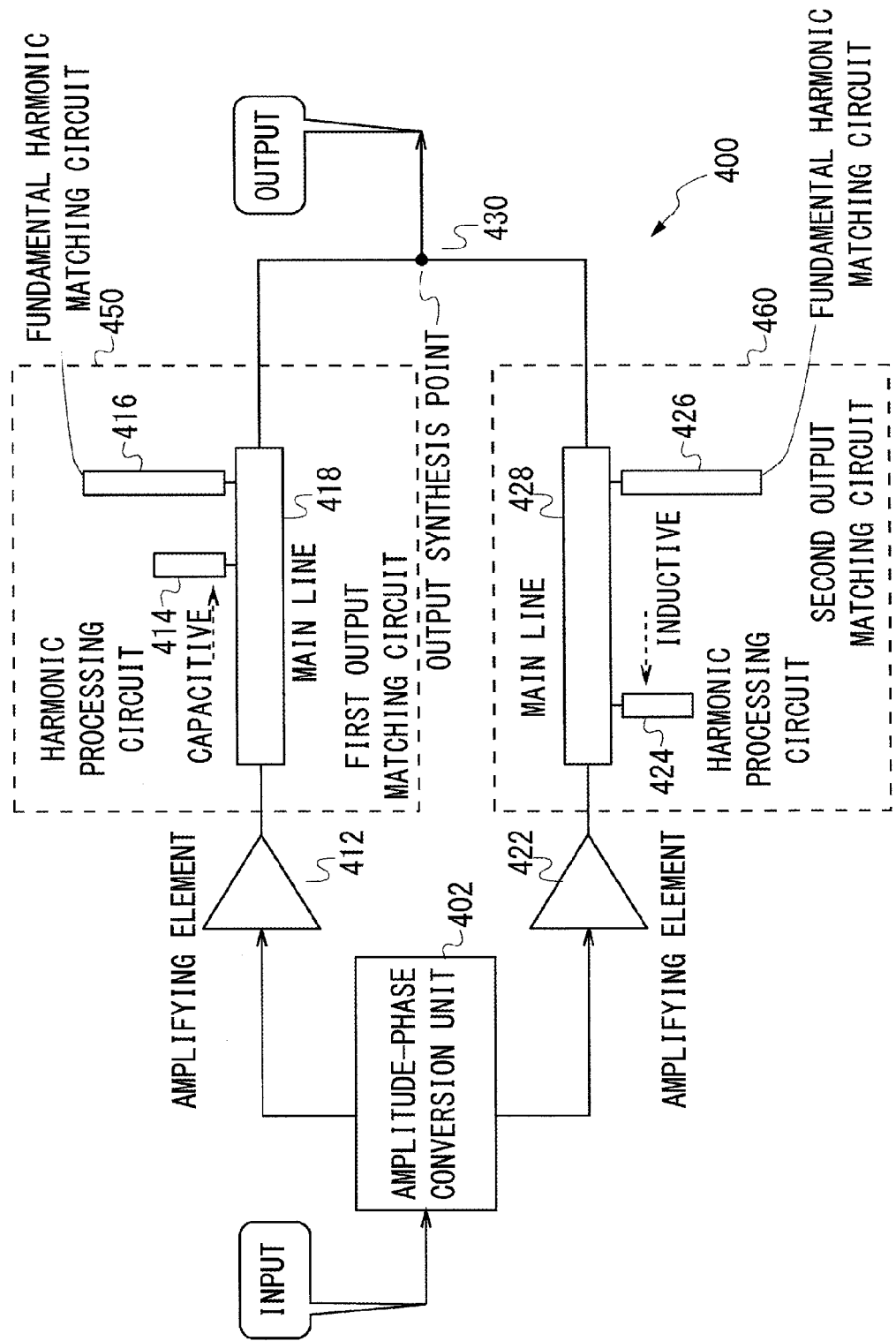
FIG. 13 is a diagram illustrating a configuration example of an amplifying apparatus 400 according to one embodiment.

FIG. 13 is a diagram illustrating a configuration example of an amplifying apparatus 400 according to the present example. The amplifying apparatus 400 is an Out-Phasing type amplifying apparatus. The amplifying apparatus 400 as illustrated in FIG. 13 includes an amplitude-phase conversion unit 402, a first amplifying element 412, a first output matching circuit 450, a second amplifying element 422, a second output matching circuit 460 and an output synthesis point 430. The first output matching circuit 450 includes a harmonic processing circuit 414, a fundamental harmonic matching circuit 416 and a main line 418. The second output matching circuit 460 includes a harmonic processing circuit 424, a fundamental harmonic matching circuit 426 and a main line 428. The harmonic processing circuit 414 and the harmonic processing circuit 424 is a harmonic processing circuit for the third-order harmonic.

The amplitude-phase conversion unit 402 converts an input signal S(t) to two signals with an amplitude with a phase difference determined depending on the amplitude of the input signal. The amplitude-phase conversion unit 402 outputs one of the converted signals to the first amplifying element 412 and the other of the converted signals to the second amplifying element 422. The signal S1(t) output to the first amplifying element 412 and the signal S2(t) output to the second amplifying element 422 are similar to the signals as described in Configuration Example 1.

The first amplifying element 412 amplifies the signal S1(t). The amplitude M of the signal S1(t) is constant. Therefore, an element which amplifies signals with an amplitude M with high efficiency is selected as the first amplifying element 412.

The harmonic processing circuit 414 is a circuit for determining the impedance for the third-order harmonic of the fundamental harmonic in the amplifying apparatus 400. The harmonic processing circuit 414 is provided at a position set farther from the first amplifying element 412 than the position set based on the phase condition with which the efficiency increases when the load for the fundamental harmonic is represented by real number. With this arrangement, the reflection phase of the harmonic becomes capacitive. The harmonic processing circuit 414 is, for example, an open stub with a length of $\lambda/12$ of the fundamental harmonic in case of a third-order harmonic. The harmonic processing circuit 414 is connected in parallel with the first amplifying element 412.

The fundamental harmonic matching circuit 416 is a circuit for achieving impedance matching for the fundamental harmonic, namely, the fundamental frequency in the amplifying apparatus 400.

The second amplifying element 422 amplifies the signal S2(t). The amplitude M of the signal S2(t) is constant. Therefore, an element which amplifies signals with an amplitude M with high efficiency is selected as the second amplifying element 422.

The harmonic processing circuit 424 is a circuit for determining the impedance for the third-order harmonic of the fundamental harmonic in the amplifying apparatus 400. The harmonic processing circuit 424 is provided at a position set farther from the second amplifying element 422 than the position set based on the phase condition with which the efficiency increases when the load for the fundamental harmonic is represented by real number. With this arrangement, the reflection phase of the harmonic becomes inductive. The harmonic processing circuit 424 is, for example, an open stub with a length of $\lambda/12$ of the fundamental harmonic in case of a third-order harmonic. The harmonic processing circuit 424 is connected in parallel with the second amplifying element 422.

The fundamental harmonic matching circuit 426 is a circuit for achieving impedance matching for the fundamental harmonic, namely, the fundamental frequency in the amplifying apparatus 400.

The first amplifying element 412 and the second amplifying element 422 is directly connected with the output synthesis point 430 after the fundamental harmonic matching is achieved.

Figure 14:
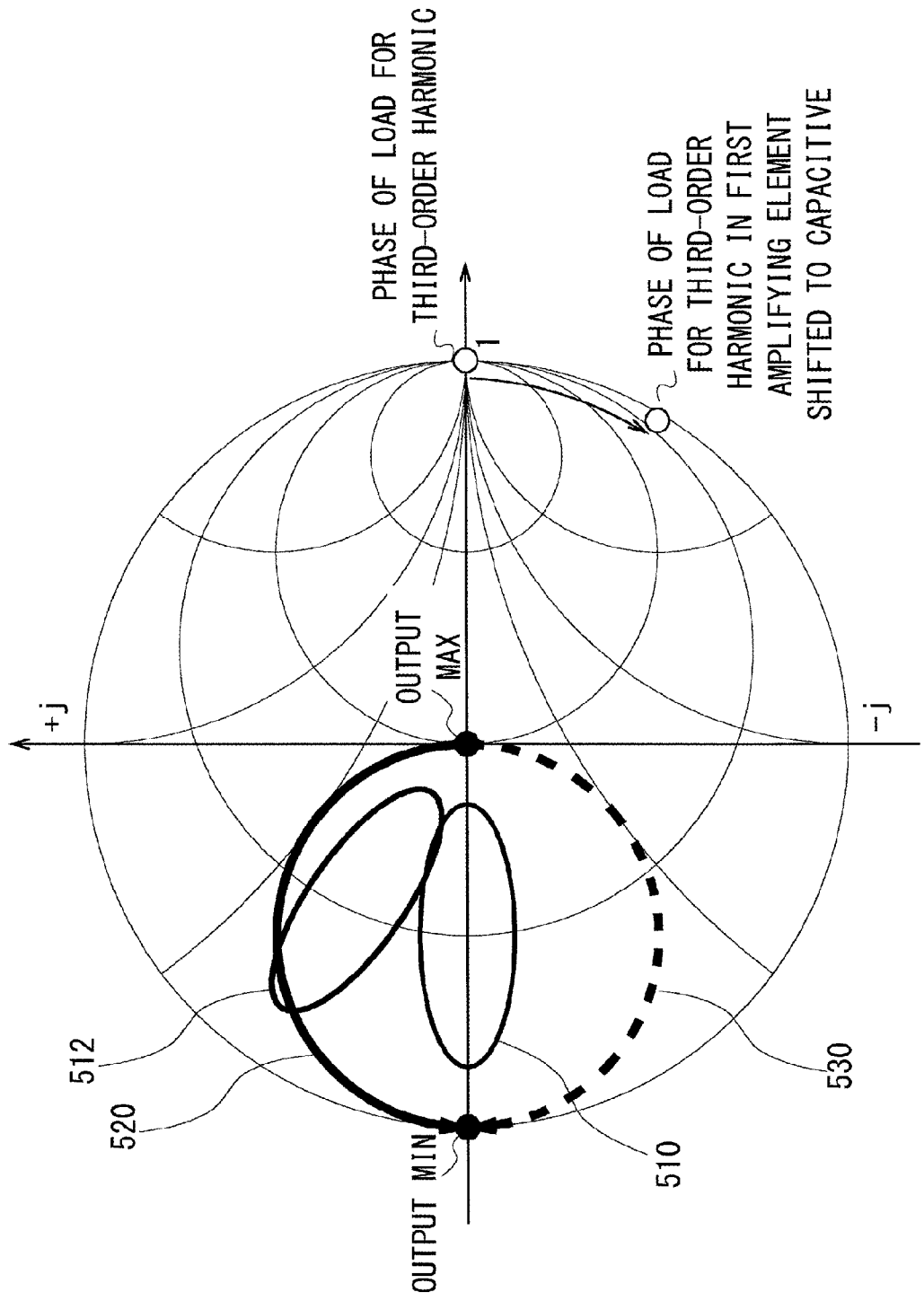
FIG. 14 is a diagram of a Smith chart illustrating the load from an output synthesis point to a first amplifying element.

FIG. 14 is a diagram of an example of a Smith chart illustrating loads from the output synthesis point to the first amplifying element. The ellipsoidal closed curve 510 is similar to the closed curve 10 as illustrated in FIG. 5. The closed curve 512 is ellipsoidal and represents an area (condition) in which the efficiency increases when the load is varied at a position between the position at which the first amplifying element 412 is connected with the matching circuit and the output side. The solid line 520 represents values of the load from the output synthesis point to the first amplifying element 412. And the broken line 530 represents values of the load from the output synthesis point to the second amplifying element 422.

When the reflection phase of the third-order harmonic on the side of the first amplifying element 412 is shifted to be capacitive, the closed curve 512 is shifted to be closer to the inductive side than the closed curve 510 is to the inductive side. The closed curve 512 is closer to the solid line 520. Therefore, the amplifying apparatus 400 which is an Out-Phasing type amplifier can use a signal which is subject to an amplitude-phase conversion to set an optimum load condition of the first amplifying element 412 at a position near the load from the output synthesis point 430 to the first amplifying element 412 which is determined when the phase is changed. That is, the amplifying apparatus 400 can set an area in which the efficiency increases to be closer to the load from the output synthesis point 430 to the first amplifying element 412 without use of a transmission line.

Figure 15:
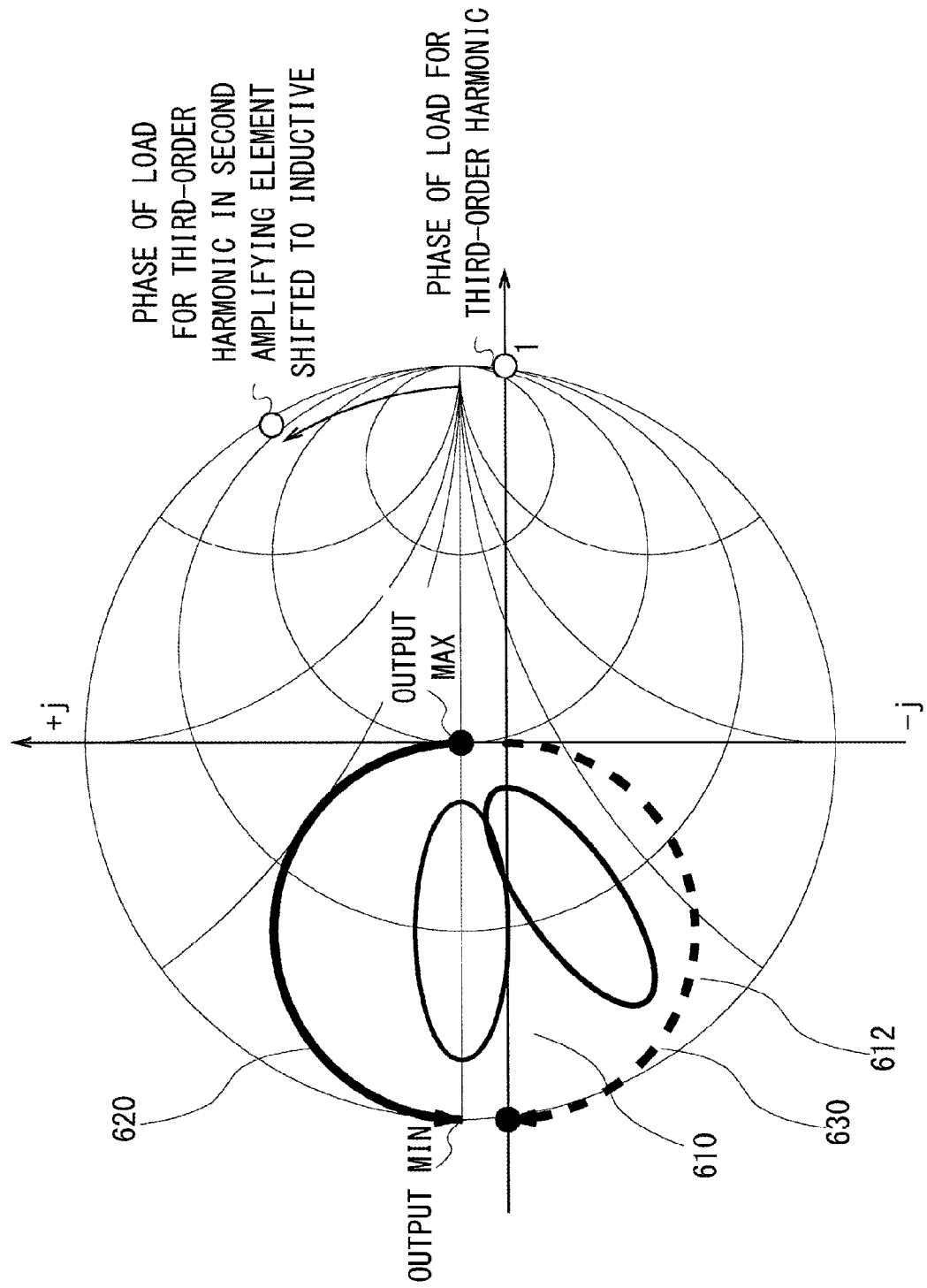
FIG. 15 is a diagram of a Smith chart illustrating the load from an output synthesis point to a second amplifying element.

FIG. 15 is a diagram of a Smith chart illustrating an example of the load from the output synthesis point to the second amplifying element. The ellipsoidal closed curve 610 is similar to the closed curve 10 as illustrated in FIG. 5. The closed curve 612 is ellipsoidal and represents an area (condition) in which the efficiency increases when the load is varied on the output side for the connection point at which the second amplifying element 422 is connected with the matching circuit. The solid line 620 represents values of the load from the output synthesis point to the first amplifying element 412. And the broken line 630 represents values of the load from the output synthesis point to the second amplifying element 422.

When the reflection phase of the third-order harmonic on the side of the second amplifying element 422 is shifted to be inductive, the closed curve 612 is shifted to be closer to the inductive side than the closed curve 610 is to the capacitive side. The closed curve 612 is closer to the broken line 630. Therefore, the amplifying apparatus 400 which is an Out-Phasing type amplifier can use a signal which is subject to an amplitude-phase conversion to set an optimum load condition of the second amplifying element 422 at a position near the load from the output synthesis point 430 to the second amplifying element 422 which is determined when the phase is changed. That is, the amplifying apparatus 400 can set an area in which the efficiency increases to be closer to the load from the output synthesis point 430 to the second amplifying element 422 without use of a transmission line.

The amplifying apparatus 400 can set an optimum load for achieving high efficiency without inserting a transmission line for phase rotation between the output synthesis point 430 and a matching circuit for each amplifying element, by setting different third-order harmonic reflection phases for the two amplifying elements as described above. Therefore, since the line length can be 0 or shortened, optimum wide-bandwidth operations can be achieved in the present example.

Similar to the configurations in Configuration Example 1-2, the locus of the load can be rotated to be closer to an area in which the high efficiency as described above can be achieved by inserting a transmission line between the main line and the output synthesis point in Configuration Example 2.

The configurations as described above can be employed when both a harmonic processing circuit for the second-order harmonic and a harmonic processing circuit for the third-order harmonic are used in the amplifying apparatus 400. In addition, other harmonic processing circuits for the fourth-order harmonic, the fifth-order harmonic etc. can be used in the amplifying apparatus 400. In this case, harmonic processing circuits for odd-order harmonic are configured in accordance with the harmonic processing circuit for second-order harmonic as described in Configuration Examples 1-1 and 1-2, and harmonic processing circuits for even-order harmonic are configured in accordance with the harmonic processing circuit for third-order harmonic as described in Configuration Example 2.

(Configuration Example 3)

Figure 16:
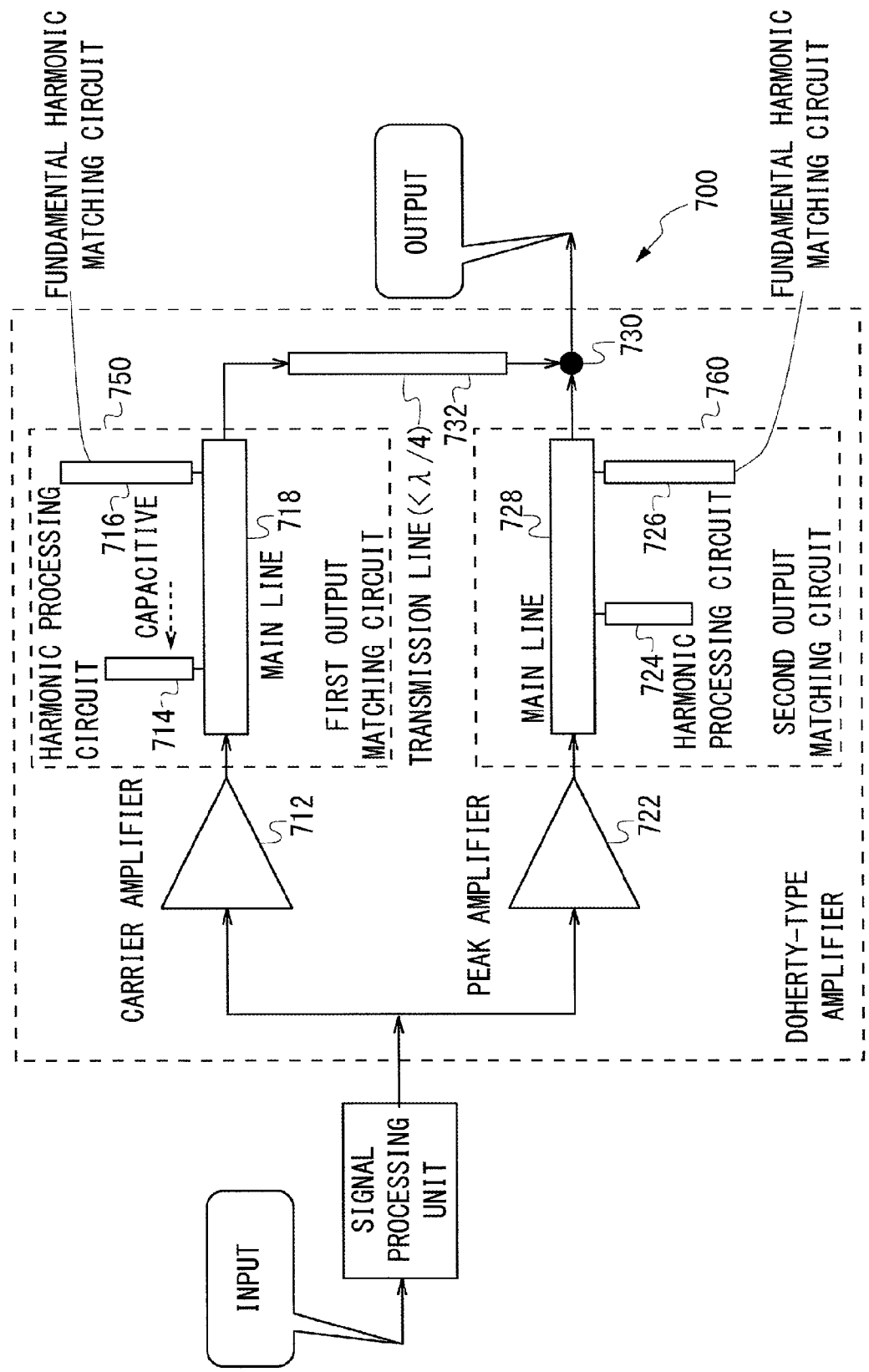
FIG. 16 is a diagram illustrating a configuration example of an amplifying apparatus 700 according to one embodiment.

FIG. 16 is a diagram illustrating a configuration example of an amplifying apparatus 700 according to the present example. The amplifying apparatus 700 is a Doherty type amplifying apparatus. The amplifying apparatus 700 as illustrated in FIG. 16 includes a carrier amplifier 712, a first output matching circuit 750, a peak amplifier 722, a second output matching circuit 760, an output synthesis point 730 and a main line 732. The first output matching circuit 750 includes a harmonic processing circuit 714, a fundamental harmonic circuit 716 and a main line 718. The second output matching circuit 760 includes a harmonic processing circuit 724, a fundamental matching circuit 726 and a main line 728. Signals are input into the amplifying apparatus 700 from a signal processing unit. The signal processing unit suppresses the peak input signal power and applies distortions to the input signals. The signals processes by the signal processing unit are output to the carrier amplifier 712 and the peak amplifier 722.

The carrier amplifier 712 can operate in an area in which the input signal power is low. The carrier amplifier 712 is biased from Class B to Class AB.

The harmonic processing circuit 714 is a circuit for determining the impedance for the harmonics of the fundamental harmonic in the amplifying apparatus 700. The harmonic processing circuit 714 is provided at a position closer to the carrier amplifier 712 than the position at which the efficiency increases when the load of the fundamental harmonic is represented by real number. With this arrangement, the reflection phases for the harmonics become capacitive.

The fundamental harmonic matching circuit 716 is a circuit for achieving impedance matching for the fundamental harmonic, namely, the fundamental frequency in the amplifying apparatus 700.

The main line 718 is provided between the carrier amplifier 712 and the output synthesis point 730. The harmonic processing circuit 714 and the fundamental harmonic processing circuit 716 are connected with the main line 718.

The carrier amplifier 722 does not operate in an area in which the input signal power is low and operates when the input signal power is above a predetermined threshold. The carrier amplifier 722 is biased to Class C.

The harmonic processing circuit 724 is a circuit for determining the impedance for the harmonics in the amplifying apparatus 700.

The fundamental harmonic processing circuit 726 is a circuit for achieving impedance matching for the fundamental harmonic, namely, the fundamental frequency in the amplifying apparatus 700.

The main line 728 is provided between the peak amplifier 722 and the output synthesis point 730. The harmonic processing circuit 724 and the fundamental harmonic matching circuit 726 are connected with the main line 728.

The carrier amplifier 712 and the peak amplifier 722 are connected with each other at the output synthesis point 730 after the matching for the fundamental harmonic is achieved.

The transmission line 732 converts the output load impedance to impedance set near the operation point for the carrier amplifier 712 at which the high efficiency can be achieved when the peak amplifier is switched off. The transmission line 732 is, for example, a quarter-wave impedance conversion circuit.

Figure 1:
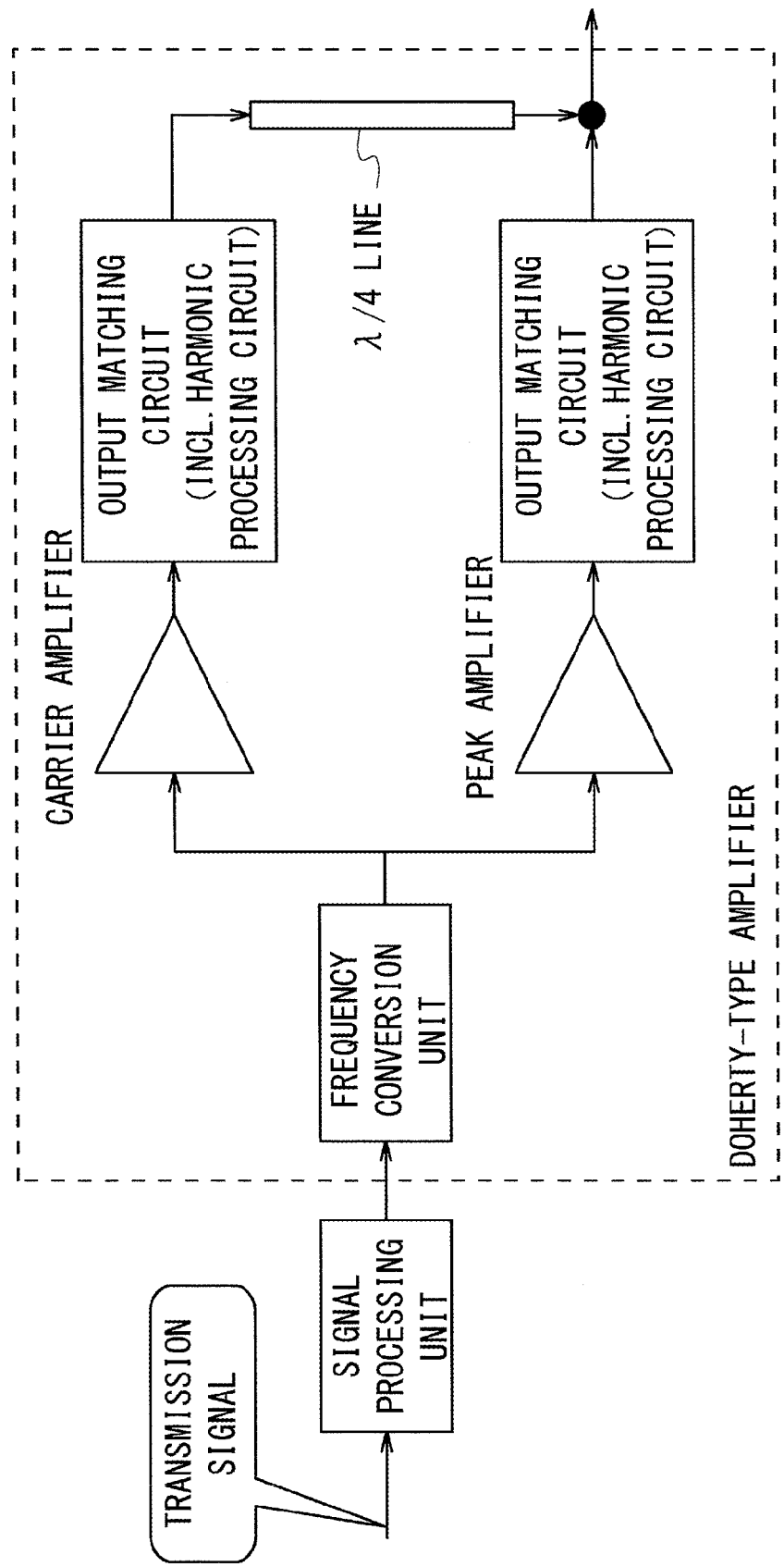
FIG. 1 is a diagram illustrating a configuration example of a Doherty type amplifier.
Figure 17:
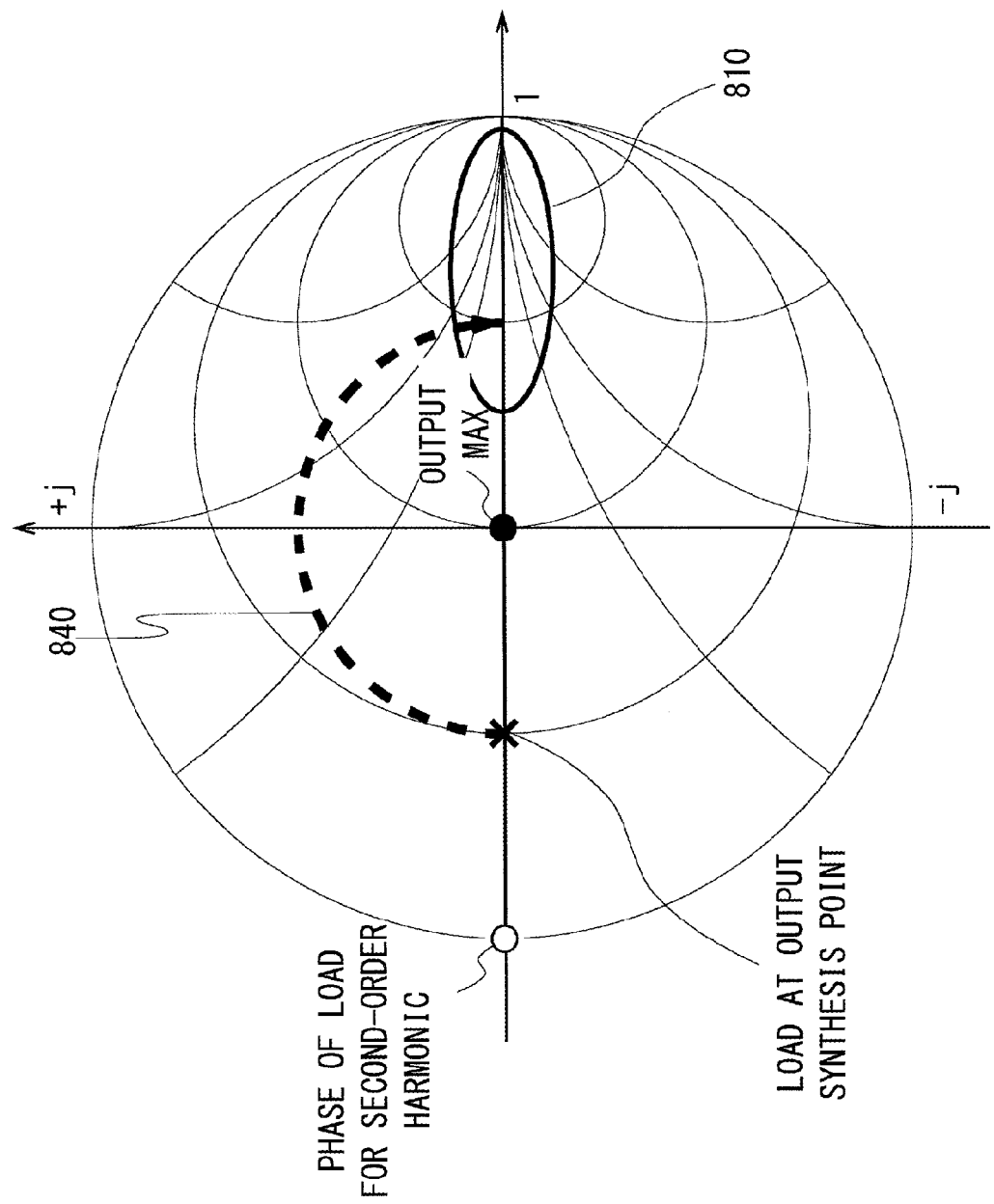
FIG. 17 is a diagram of a Smith chart illustrating the change in the load of a carrier amplifier in the Doherty type amplifier as illustrated in FIG. 1.

FIG. 17 is a diagram of a Smith chart illustrating the change in the load of a carrier amplifier employed in the Doherty type amplifier as illustrated in FIG. 1. The closed curve 810 is ellipsoidal and represents the contour line of the efficiency achieved by the carrier amplifier. The inner a position is in the closed curve 810, the higher the efficiency becomes. When the load corresponding to a point inside of the closed curve 810 is achieved, the amplifier can operate with high efficiency. The broken line 840 represents impedance conversion by use of a $\lambda/4$ line. When the $\lambda/4$ line is employed, the output load impedance is converted to impedance set near the operation point for the carrier amplifier at which the high efficiency can be achieved when the peak amplifier is switched off.

Figure 18:
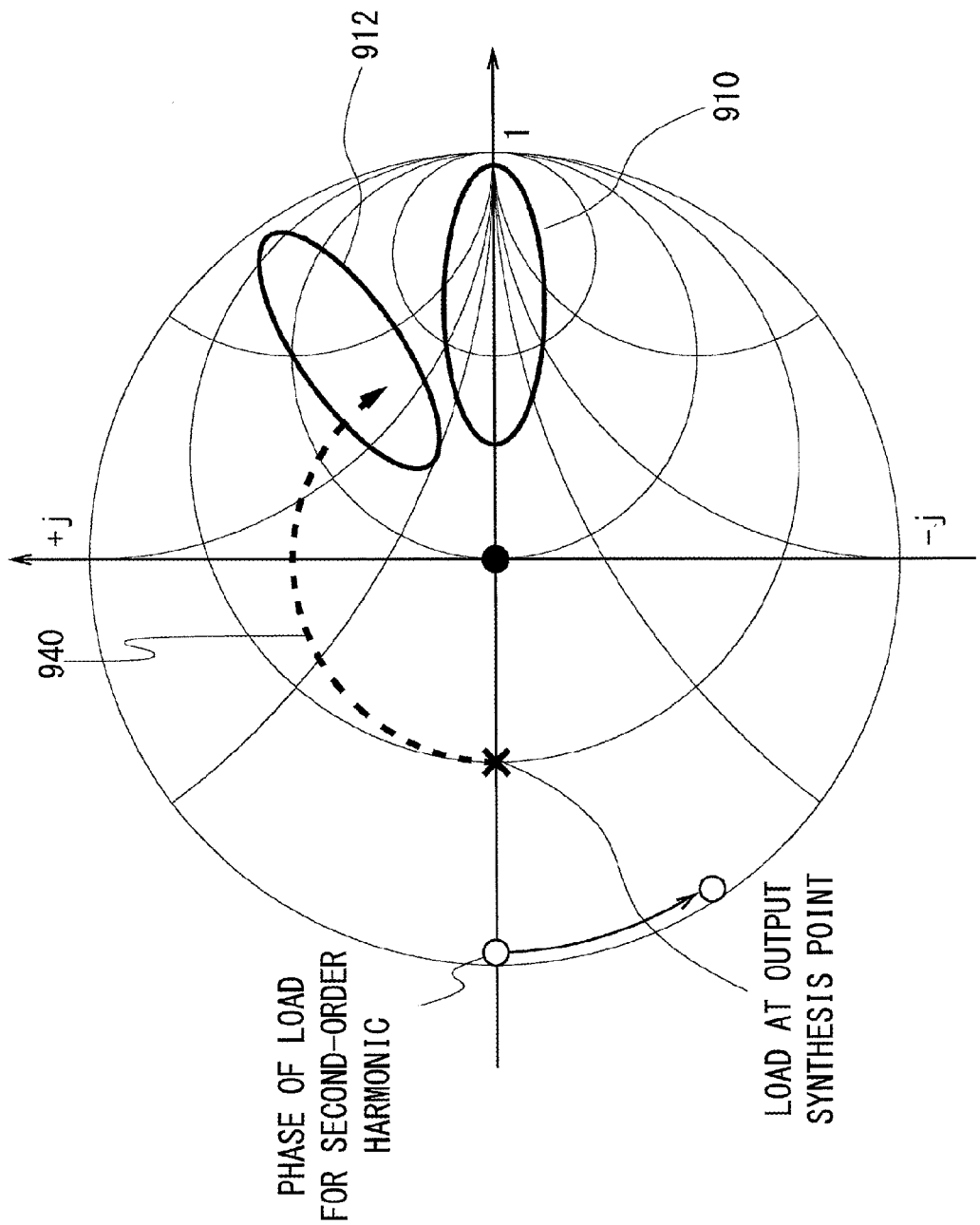
FIG. 18 is a diagram of a Smith chart illustrating the change in the load of a carrier amplifier in the amplifying apparatus 700.

FIG. 18 is a diagram of a Smith chart illustrating the change in the load of a carrier amplifier employed in the amplifying apparatus 700. The ellipsoidal closed curve 910 is similar to the closed curve 810 as illustrated in FIG. 17. The closed curve 912 is ellipsoidal and represents an area of the load in which the carrier amplifier 712 operates with high efficiency. When the reflection phases for the harmonics for the carrier amplifier 712 are shifted to be capacitive, the area of the load represented by the closed curve 912 in which the carrier amplifier 712 operates with high efficiency is shifted to be more inductive than the area represented by the closed curve 910. The broken line 940 represents the result of impedance conversion achieved by the transmission line 732. Since the transmission line 732 is shorter than $\lambda/4$, the output load impedance is converted to impedance set near the operation point for the carrier amplifier at which the high efficiency can be achieved when the peak amplifier is switched off. With this arrangement, the transmission line, namely, the impedance conversion circuit can be shorter than $\lambda/4$. Since the transmission line is shortened, the amplifying apparatus 700 can achieve the output with high efficiency in a wider bandwidth.

Operations and Effects in Embodiments

The amplifying apparatus 100 includes the harmonic processing circuit 114 connected in parallel with the first amplifying element 112 and the harmonic processing circuit 124 connected in parallel with the second amplifying element 122. The harmonic processing circuit 114 and the harmonic processing circuit 124 are shifted from the position (condition) at which the efficiency increases when the load for the fundamental harmonic is represented by real number to a position corresponding to the capacitive side or the inductive side. When the positions of the harmonic processing circuits 114, 124 are shifted to the capacitive side or the inductive side, the (reflection) phases of the loads for the harmonics are shifted to the inductive side or the capacitive side, respectively. And when the position of the harmonic processing circuits 114, 124 are shifted to the capacitive side or the inductive side, the (load) areas in which the first amplifying element 112 and the second amplifying element 122 can operate with high efficiency are shifted to the capacitive side or the inductive side, respectively. Since the area in which the high efficiency can be achieved becomes closer to the locus of the load from the output synthesis point to the first amplifying element or the second amplifying element, the efficiency achieved by the amplifying apparatus 100 can be increased. In addition, since a transmission line is not used in the amplifying apparatus 100, the amplification can be achieved with high efficiency in a wider bandwidth.

Further, when a position at which the harmonic processing circuit is provided are varied in the amplifying apparatus 1100, the area in which the high efficiency can be achieved is shifted to the inductive side or the capacitive side. Additionally, when the transmission line 1129 is inserted between the main line 1128 and an output synthesis point 1130 in the amplifying apparatus 1100, the locus of the load can be closer to the area in which the high efficiency can be achieved. Since the amplifying apparatus 1100 employs the harmonic processing circuit and the transmission line, the locus of the load and the area in which the high efficiency can be achieved are shifted closer to each other. Moreover, since the length of the transmission line can be shorter than the electric length of n in the amplifying apparatus 1100, the amplification can be achieved with high efficiency in a wider bandwidth.

In addition, when the phase of the load, namely, the reflection phase for the harmonics such as the second-order harmonic and the third-order harmonic of the carrier amplifier 712 in the amplifying apparatus 700 is shifted to the capacitive side, the area of the load in which the carrier amplifier 700 can operate with high efficiency is shifted to the inductive side. Since the area of the load in which the high efficiency can be achieved is shifted to the inductive side in the amplifying apparatus 700, the length of the transmission line, namely, the impedance conversion circuit can be shorter than $\lambda/4$. When the length of the transmission line is shortened as described above in the amplifying apparatus 700, the amplification can be achieved with high efficiency in a wider bandwidth.

Although specific embodiments are described above, the configurations described and illustrated in each configuration example can be arbitrarily combined. Additionally, the configuration described in one configuration example can be employed in the configuration described in another configuration example.

<<Computer Readable Recording Medium>>

It is possible to record a program which causes a computer to implement any of the functions described above on a computer readable recording medium. In addition, by causing the computer to read in the program from the recording medium and execute it, the function thereof can be provided.

The computer readable recording medium mentioned herein indicates a recording medium which stores information such as data and a program by an electric, magnetic, optical, mechanical, or chemical operation and allows the stored information to be read from the computer. Of such recording media, those detachable from the computer include, e.g., a flexible disk, a magneto-optical disk, a CD-ROM, a CD-R/W, a DVD, a DAT, an 8-mm tape, and a memory card. Of such recording media, those fixed to the computer include a hard disk and a ROM (Read Only Memory).

An amplifying apparatus according to the embodiments can operate with high efficiency in a wide bandwidth.

All example and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. An amplifying apparatus, comprising:
an amplitude-phase conversion unit to separate an input signal into a first signal with a predetermined amplitude and a second signal with the predetermined amplitude, wherein a phase difference between the first signal and the second signal depends on an amplitude of the input signal;
a first amplifying unit to amplify the first signal;
a first matching circuit including a main line connected with the first amplifying unit and a first harmonic processing circuit connected with the main line, wherein a length of the line of the first harmonic processing circuit short-circuits a harmonic from the first amplifying unit;
a second amplifying unit to amplify the second signal;
a second matching circuit including a main line connected with the second amplifying unit and a second harmonic processing circuit connected with the main line of the second matching circuit, wherein a length of the line of the second harmonic processing circuit short-circuits a harmonic from the second amplifying unit; and
an output synthesis unit to synthesize an output from the first matching circuit and an output from the second matching circuit,
wherein a distance from the output side of the first amplifying unit to a position at which the first harmonic processing circuit is connected with the main line of the first matching circuit differs from a distance from the output side of the second amplifying unit to a position at which the second harmonic processing circuit is connected with the main line of the second matching circuit.

2. The amplifying apparatus according to claim 1, further comprising: a transmission line provided between the second matching circuit and the output synthesis unit, wherein an electrical length of the transmission line is shorter than ½ of a fundamental wavelength of a signal amplified by the amplifying apparatus, wherein the first matching circuit and the output synthesis unit are directly connected with each other.

3. An amplifying apparatus, comprising:
a carrier amplifier and a peak amplifier, wherein a harmonic signal is input into the carrier amplifier and the peak amplifier in parallel;
a first matching circuit including a first harmonic processing circuit connected in parallel with the carrier amplifier;
a second matching circuit including a second harmonic processing circuit connected in parallel with the peak amplifier; and
a transmission line connected with the first matching circuit, wherein an electrical length of the transmission line is shorter than ¼ of a fundamental wavelength of a signal amplified by the amplifying apparatus,
wherein a distance from the output side of the carrier amplifier to a position at which the first harmonic processing circuit is connected in parallel with the carrier amplifier differs from a distance from the output side of the peak amplifier to a position at which the second harmonic processing circuit is connected in parallel with the peak amplifier.

* * * * *